US012809052B2

(12) United States Patent
Cha et al.

(10) Patent No.: US 12,809,052 B2
(45) Date of Patent: Nov. 24, 2026

(54) WELL LOG QUALITY IMPROVEMENT APPARATUS AND WELL LOG QUALITY IMPROVEMENT METHOD

(71) Applicants: SK INNOVATION CO., LTD., Seoul (KR); SK EARTHON CO., LTD., Seoul (KR)

(72) Inventors: Seungjoon Cha, Daejeon (KR); Tae Hoon Kim, Daejeon (KR); Seung Jun Lee, Daejeon (KR); Jongyoung Jun, Daejeon (KR)

(73) Assignees: SK INNOVATION CO., LTD., Seoul (KR); SK EARTHON CO., LTD., Seoul (KR)

( * ) Notice: Subject to any disclaimer, the term of this patent is extended or adjusted under 35 U.S.C. 154(b) by 428 days.

(21) Appl. No.: 18/582,508

(22) Filed: Feb. 20, 2024

(65) Prior Publication Data

US 2024/0361494 A1 Oct. 31, 2024

(30) Foreign Application Priority Data

Apr. 27, 2023 (KR) ........................ 10-2023-0055728

(51) Int. Cl.
*G01V 20/00* (2024.01)
*G06F 30/28* (2020.01)

(52) U.S. Cl.
CPC .............. *G01V 20/00* (2024.01); *G06F 30/28* (2020.01)

(58) Field of Classification Search
CPC . G01V 20/00; G01V 1/50; G01V 3/38; G01V 2210/60; G06F 30/28;

(Continued)

(56) References Cited

U.S. PATENT DOCUMENTS 6,359,434 B1 * 3/2002 Winslow ............ G01N 27/9046 702/38
10,255,473 B2 * 4/2019 Spencer Elkington ...................... E21B 49/006

(Continued)

FOREIGN PATENT DOCUMENTS

CN 102312670 B 6/2014
WO 2021/046576 A1 3/2021

OTHER PUBLICATIONS

Banas, R. et al., "Novel Methodology for Automation of Bad Well Log Data Identification and Repair," SPWLA 62nd Annual Logging Symposium, May 17-20, 2021, SPWLA-2021-0070 (22 pages).

*Primary Examiner* — Tung S Lau
(74) *Attorney, Agent, or Firm* — IP&T GROUP LLP

(57) ABSTRACT

Proposed are a well log quality improvement apparatus and a well log quality improvement method. In an embodiment, a well log quality improvement method includes performing a quality controlling operation on a well log by inputting the well log to a well logging data processing model to train the model and by determining a bad hole section corresponding to a log section associated with a bad hole, performing a conditioning operation on the well log by replacing the bad hole section included in the well log with alternative data, and normalizing a distribution of data of the well log according to a distribution of data of a reference well log obtained from a reference well. By improving the quality of the well log, the overall accuracy of oil and gas exploration may be improved, and time required for data analysis may be reduced.

20 Claims, 21 Drawing Sheets

(58) Field of Classification Search
CPC ........ G06F 16/215; G06F 16/26; G06F 17/18; G06F 18/24147; G06F 18/24323; G06F 18/2433; E21B 47/26; E21B 47/12; G06N 20/00
See application file for complete search history.

(56) References Cited

U.S. PATENT DOCUMENTS

| | | | | |
|---|---|---|---|---|
| 2017/0248736 | A1 | 8/2017 | Banas | |
| 2020/0378239 | A1 | 12/2020 | Jones et al. | |
| 2023/0083651 | A1* | 3/2023 | Tian | G01V 1/307 702/14 |

* cited by examiner

WELL LOG QUALITY IMPROVEMENT APPARATUS AND WELL LOG QUALITY IMPROVEMENT METHOD

CROSS REFERENCE TO RELATED APPLICATION

This patent document claims the priority and benefits of Korean Patent Application No. 10-2023-0055728, filed Apr. 27, 2023, the entire contents of which is incorporated herein by reference for all purposes.

TECHNICAL FIELD

The disclosed technology relates to a well log quality improvement apparatus and a well log quality improvement method.

BACKGROUND

Well logging is a method for collecting data for various parameters of underground structures and formation features at various depths below surface at locations of interest for gas and oil explorations. A well log chart can be used to graphically show the relationship of a parameter measured as a function of the depth.

Well logging is a method for collecting physical and chemical properties of subsurface formation at various depth below surface at location of interest for gas and oil exploration. Well logs measured from wells during an oil and gas exploration process and a drilling process are important data. Well logs may include data that is obtained by directly measuring physical and chemical properties of an underground formation during a drilling and a wireline logging after drilling with logging tools. Well logs may include erroneous data or missing data that occur during a measurement process. In order to perform oil and gas exploration by using well logs, erroneous data or missing data is required to be minimized.

SUMMARY

The disclosed technology can be implemented in some embodiments to provide a well log quality improvement apparatus and a well log quality improvement method that are capable of handling erroneous data or missing data.

In the well log quality improvement method based on some embodiments of the disclosed technology, the well log quality improvement method may include: performing a quality controlling operation on a well log by inputting a well log into a determination model for training to determine a bad hole section associated with a bad hole which is data in the well log that is inappropriate for use in a well log interpretation; performing a conditioning operation on the well log by replacing the bad hole section included in the well log with alternative data; and normalizing a distribution of data of the well log according to a distribution of data of a reference well log obtained from a reference well log.

In an embodiment, the performing the quality controlling operation may include: setting a condition and a determination model for determining the bad hole; analyzing the well log by using the condition and the determination model; and displaying a section determined as the bad hole section, the displaying of the section includes at least one of a cross-plot in which data are displayed as points according to a feature of an X-axis and a feature of a Y-axis, a depth-plot in which the section determined as the bad hole for features selected as an input feature is displayed, and a bad hole score plot in which: bad hole scores are sorted from a small value to a large value; a line graph is drawn; and a point where a slope rapidly changes is displayed.

In an embodiment, the setting of the condition and the determination model may include inputting a selection a user by providing: a first interface screen in which a well log file stored in a storage unit is selected, a position of a line displaying a feature unit is selected, and a value determined as null data is input; a second interface screen in which each column where a name of a well, a depth, a record of whether or not the bad hole exists, and the input feature are positioned is selected as variables; a third interface screen in which at least one of a None, a MinMaxScaler, a RobustScaler, or a StandardScaler is selected as a scaler; a fourth interface screen in which at least of a KNN, a COPOD, an Iforest, and an OCSVM is selected as a determination model; and a fifth interface screen in which a parameter of the determination model is input.

In an embodiment, the analyzing of the well log may include, in response to multiple parameters that are simultaneously input in an interface screen where the parameter of the determination model is input, generating each determination model for the multiple parameters at once, and integrating and displaying results.

In an embodiment, the performing the quality controlling operation may further include merging results of determining the bad hole section with various conditions for one well log, and the merging of the results includes displaying multiple results determining the bad hole section in depth-plots, and generating a bad hole determination result by reflecting an area selected from the depth-plots in a merged depth-plot.

In an embodiment, the performing conditioning operation may include: setting a condition and a generation model for generating the alternative data; replacing null data of the well log with the alternative data by generating the alternative data using the generation model and the condition are used and reflecting a depth trend; matching a trend of synthetic data generated using an empirical formula to a trend of the well log replaced with the alternative data by adjusting the synthetic data using an auto trend matching method; and replacing the bad hole section of the well log with the synthetic data that is adjusted.

In an embodiment, the replacing of the null data with the alternative data may be configured perform any one of: a first operation in which a moving average as the generation model is used for generating the alternative data by using data that is not the null data of the well log and the null data is replaced with the alternative data; a second operation in which a first polynomial fitting as the generation model is used for generating the alternative data in which a depth trend trained from data that is not the null data of the well log is reflected and the null data is replaced with the alternative data; and a third operation in which a second polynomial fitting as the generation model is used for generating the alternative data by reflecting a depth trend trained from data that is not null data of a neighbor well log and by using data that is not the null data of the well log, and then by replacing the null data with the alternative data.

In an embodiment, the adjusting of the synthetic data may include: acquiring a trend of the well log replaced with the alternative data by using a moving average method; acquiring a trend of the synthetic data generated from the empirical formula by using the moving average method; and matching the trend of the synthetic data with the trend of the well log replaced with the alternative data by adjusting a window size of a moving average.

In an embodiment, the normalizing of the distribution of data of the well log may include: setting a condition for matching a data distribution of a target well log to a data distribution of the reference well log based on a condition and a trend for visualizing the well log; displaying a trend of the target well log and a trend of the reference well log by using the condition; and matching the trend of the well log to the trend of the reference well log by adjusting a trend of the well log.

In an embodiment, the displaying of the trends may include: calculating the trend of the target well log and the trend of the reference well log by using a moving average method; and displaying the trend of the target well log and the trend of the reference well log as plots based on the reference well log, the target well log, a visualization type, a bin value, ranges of features and depths to be visualized that are input upon setting the condition.

In an embodiment, the adjusting of the trend may include: filtering feature data by using a filter; calculating the trend by using filtered data; and adjusting overall data of the target well log so that the trend of the target well log is similar to the trend of the reference well log.

In the well log quality improvement apparatus based on an embodiment, the well log quality improvement apparatus may include: a processor operable to execute computer codes and instructions; a storage unit coupled to be in communication with the processor and configured to store a program code; and an input/output interface coupled to be in communication with the processor and configured to receive a command from a user and visually display data to the user, the processor is operable to execute the program code to perform: performing the quality controlling operation on a well log by inputting a well log into a determination model to train the determination model and to determine a bad hole section associated with a bad hole which is data in the well log that is inappropriate for use in a well log interpretation; performing the conditioning operation on the well log by replacing the bad hole section included in the well log with alternative data; and normalizing a distribution of data of the well log according to a distribution of data of a reference well log obtained from a reference well.

The features and advantages of the disclosed technology will be more clearly understood from the following detailed description based on the accompanying drawings.

In some embodiments of the disclosed technology, the well log quality improvement apparatus and the well log quality improvement method can replace an erroneous data section or a missing data section with data generated on the basis of neighbor data.

In some embodiments of the disclosed technology, since the quality of the well log is improved, the overall accuracy of oil and gas exploration may be improved, time required for data analysis may be reduced.

DETAILED DESCRIPTION

Hereinafter, examples of implementations of various features of the disclosed technology are described in more detail with reference to the accompanying drawings.

Figure 1:
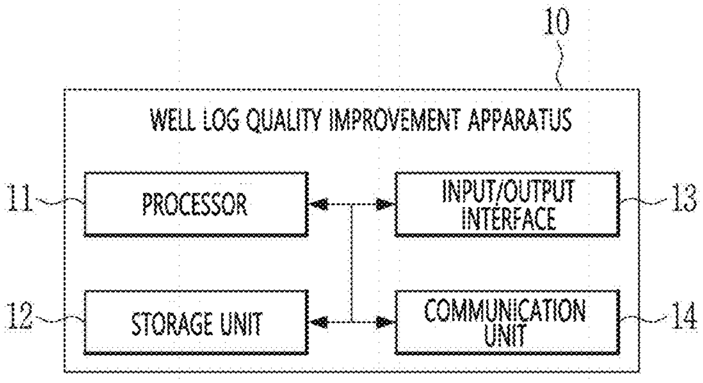
FIG. 1 illustrates an example of a well log quality improvement apparatus based on an embodiment.

FIG. 1 illustrates an example of a well log quality improvement apparatus 10 in an embodiment.

The well log quality improvement apparatus 10 may include a processor 11 (e.g., a computer processor that may include one or more microprocessors), a storage unit 12 coupled to be in communication with the processor 11 and configured to store a program code, and an input/output interface 13 coupled to be in communication with the processor 11 and configured to receive a command from a user and visually display data to the user. The well log quality improvement apparatus 10 may further include a communication unit 14 which is connected to a wired network or a wireless network and which is capable of transmitting and receiving communication signals and data.

The well log quality improvement apparatus 10 may be implemented by the processor 11 that reads and executes the program code stored in the storage unit 12. The well log quality improvement apparatus 10 may be implemented by an information processing apparatus such as a PC, a server, a laptop PC, a tablet PC, and so on. A user may access and use the well log quality improvement apparatus 10 from a remote location by using a terminal such as a smartphone.

The processor 11 may include an element capable of processing information. The processor 11 may be a CPU, a GPU, an AP, or various other computing elements. The well log quality improvement apparatus 10 may include a plurality of processors 11. The plurality of processors 11 may be connected to each other so as to transmit and receive data to each other.

The storage unit 12 may store data required to operate the well log quality improvement apparatus 10. The storage unit 12 may include a RAM, a ROM, a memory, a hard disk, a cloud storage, and so on. The storage unit 12 may store a program code written so as to perform each process of a well log quality improvement method. The program code may be executed by the processor 11. The storage unit 12 may store a plurality of well logs. Well logs are data directly measured by using a sensor in a well. Well logs may include data of various features.

The input/output interface 13 may include a keyboard, a mouse, a touch pad, a touch screen, a pen, and so on configured to receive an input from a user. The input/output interface 13 may include a display, a speaker, and so on for displaying information to a user. The input/output interface 13 may provide an interface screen for a well log quality improvement to a user, and may visually provide an analysis result to the user. In some implementations, the term "interface" can be used to indicate a user interface.

The communication unit 14 is connected to a communication network and is capable of transmitting and receiving data. The processor 11 may download well logs and may transmit the analysis result through the communication unit 14. The communication unit 14 may use various communication methods such as, 5G, 6G, satellite communication, Wi-Fi, Bluetooth, LAN, WAN, ethernet, IP4, IP6, and so on.

Figure 2:
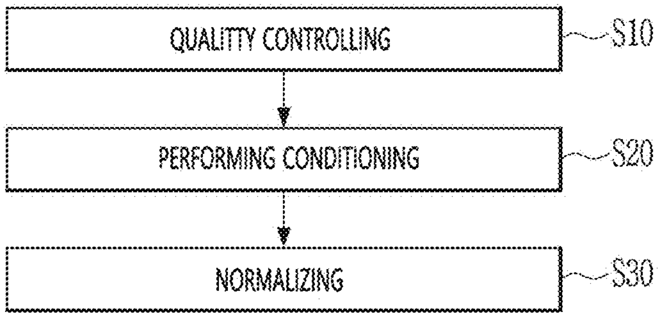
FIG. 2 is a flowchart illustrating a process of a well log quality improvement method based on an embodiment.
Figure 3:
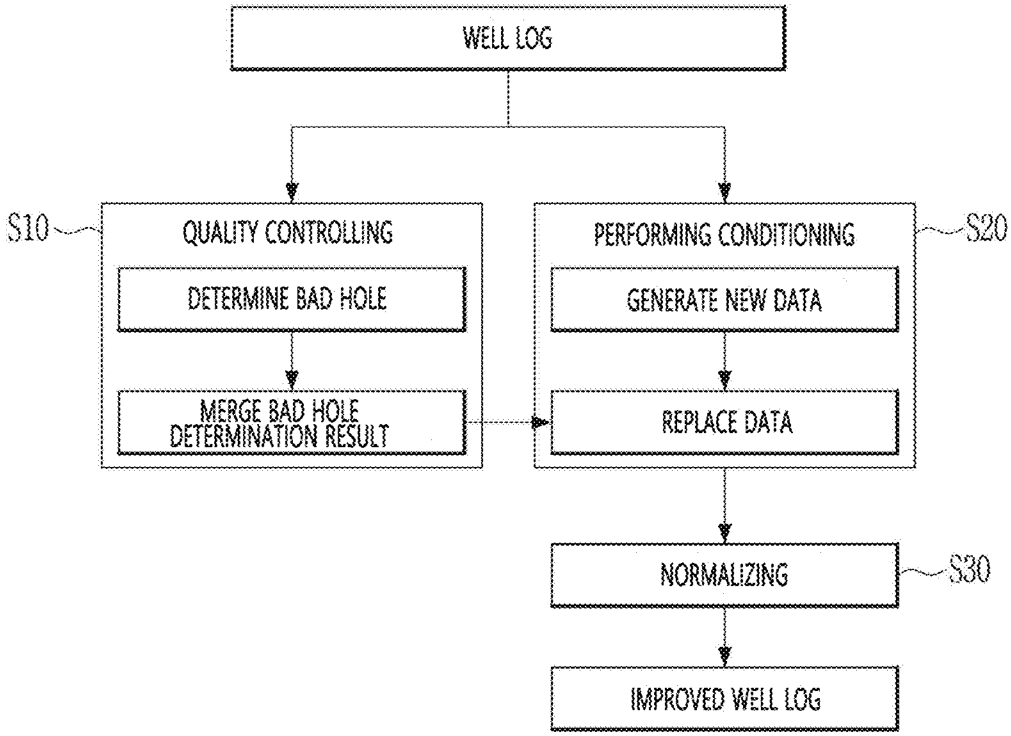
FIG. 3 illustrates an example of the well log quality improvement method based on an embodiment.

FIG. 2 is a flowchart illustrating an example of a process of a well log quality improvement method in an embodiment. FIG. 3 illustrates an example of the well log quality improvement method in an embodiment. Hereinafter, some embodiments of the disclosed technology will be described with reference to FIGS. 2 and 3.

The well log quality improvement method may include, at S10, performing a quality controlling operation on a well log by inputting the well log to train a determination model such as a neural network model or a machine learning model for training to determine a bad hole section associated with a bad hole which is data in the well log that is inappropriate for use in a well log interpretation, performing, at S20, a conditioning operation on the well log by replacing the bad hole section included in the well log with alternative data, and, at S30, normalizing a distribution of data of the well log according to a distribution of data of a reference well log obtained from a reference well. In some implementations, the term "reference well log" can be used to indicate a well log that is obtained from a reference well.

By performing the quality controlling operation at S10, it is possible to determine where a bad hole (e.g., bad borehole) BH section is in the well log. The bad hole is data that is inappropriate for use in a well log interpretation, such as an incorrectly measured section, a missing section, or an unmeasured section in the well log. In the quality controlling S10, the bad hole section may be determined by using an artificial intelligence model of various structures and by selecting various variables. For example, when a value of a specific feature measured at a specific depth in the well log corresponds to an outlier, the value of the specific feature measured at the specific depth is the bad hole section. In the quality controlling S10, bad hole determination results different from each other may be merged into one. When a different artificial intelligence model and different variables are used, data determined as the bad hole section may be different. In the quality controlling S10, an interface that allows the user to select and merge data determined as the bad hole section among a plurality of results is provided.

The conditioning operation at S20 includes modifying data included in the well log. During the conditioning operation at S20, new data or alternative data may be generated, and data determined as the bad hole may be replaced with alternative data. Null data may be included in the well log. The null data may include a section that a sensor cannot measure, or may include a section that the sensor incorrectly measured. In the performing conditioning S20, alternative data may be generated by using various methods for a section corresponding to the null data. Alternative data may be described as new data in the sense that it is generated. Alternative data may be merged into the well logs so as to replace a data section determined as the bad hole, so that conditioned well logs may be generated.

Figure 4A:
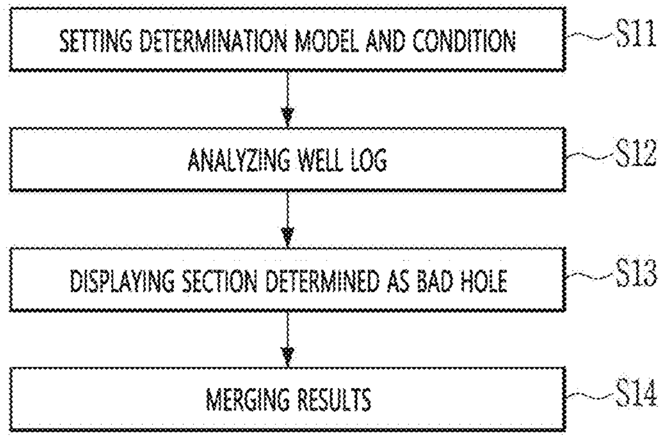
FIG. 4A is a flowchart illustrating an example of quality controlling based on an embodiment.

The normalizing at S30 includes adjusting an overall distribution by comparing data included in the conditioned well log with other well logs. By normalizing the distribution of data of the well log at S30, an interface in which various feature data included in the conditioned well log can be visually displayed to the user and a distribution of data can be adjusted according to the user's selection FIG. 4A is a flowchart illustrating an example of the quality controlling S10 based on an embodiment.

The quality controlling S10 may include, at S11, setting a condition and a determination model for determining the bad hole, at S12, analyzing the well log by using the condition and the determination model, and, at S13, displaying a section determined as the bad hole. The quality controlling S10 may further include, at S14, merging results of determining the bad hole section with various conditions for one well log.

In some implementations, the setting of the determination model and the condition S11 may include selecting, by the user, the determination model and the condition. The setting of the determination model and the condition (S11) may provide an interface screen that allows a user to select well logs, items, conditions that are to be analyzed. In some implementations, the analyzing of the well logs S12 includes using the condition and the determination model that are input and analyzing whether data determined as a bad hole in the well logs exists. A flag may be assigned to the data that is determined as a bad hole. The flag is a value indicating that the bad hole is determined. The displaying of the section determined as the bad hole S13 may provide a result visualized in plots in various methods. Since the well logs have a large amount of data and an unsupervised learning method is applied to the determination model, the determination result is required to be visually displayed. The user may determine whether a section determined as a bad hole is appropriate by examining a plot that is visually displayed. In some implementations, the merging of the results S14 may include providing multiple results on a single screen and then reflecting a region selected by a user from multiple results in a final result. This is because a section determined as a bad hole varies according to the determination model and the condition.

Figure 4B:
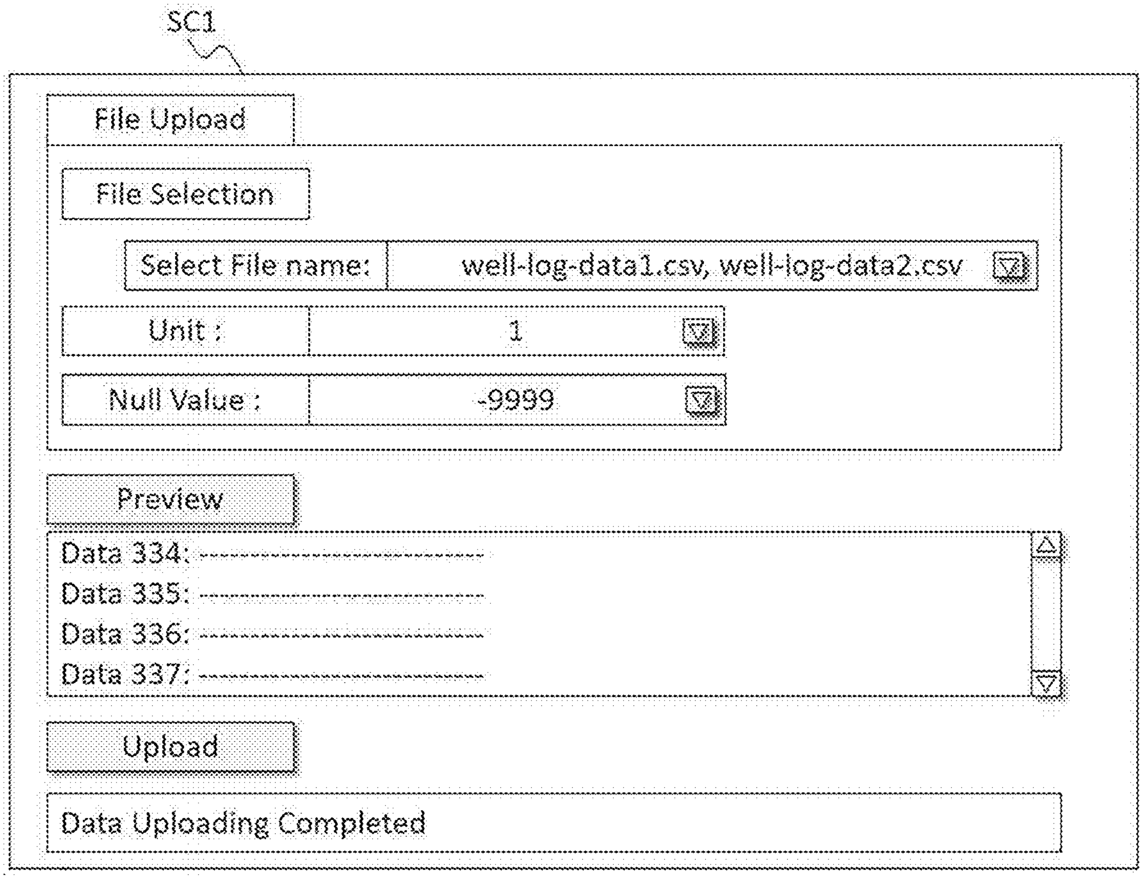
FIGS. 4B to 4D illustrate examples of interface screens showing setting a determination model and a condition based on an embodiment.
Figure 4C:
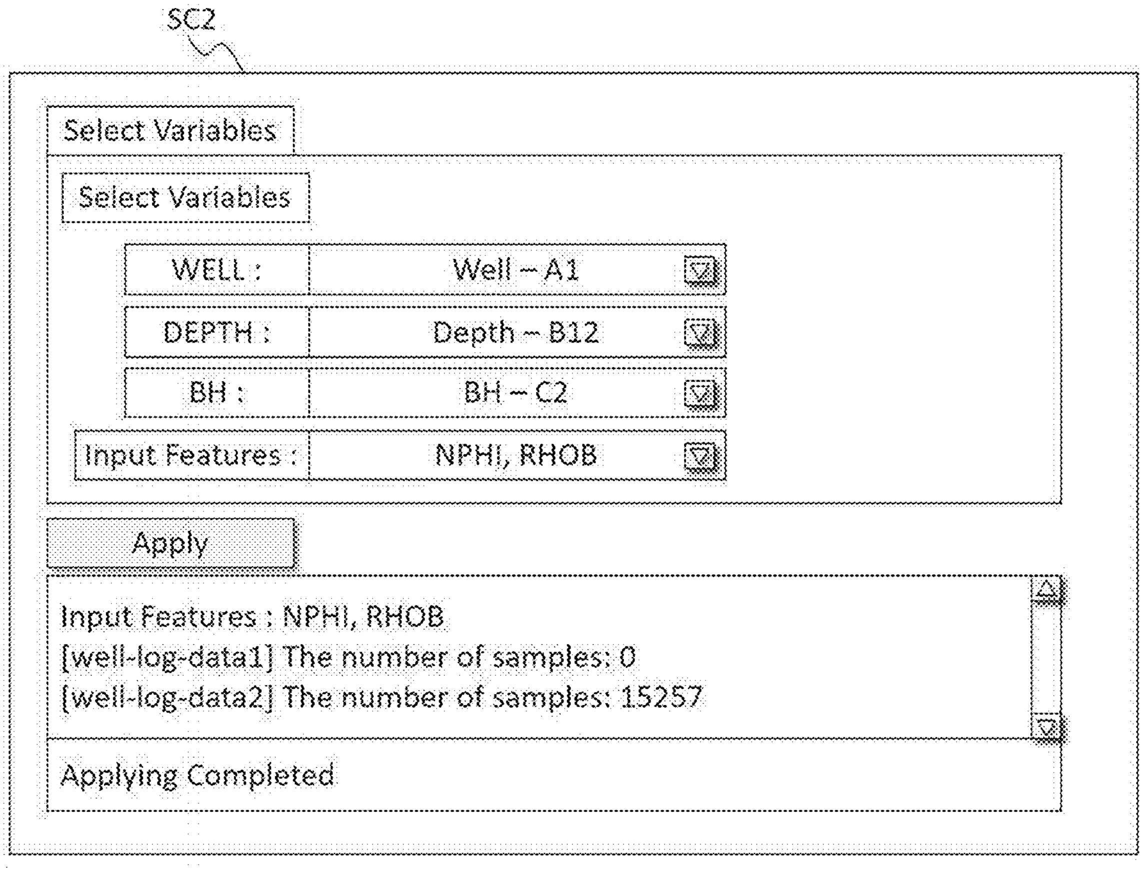
Figure 4D:
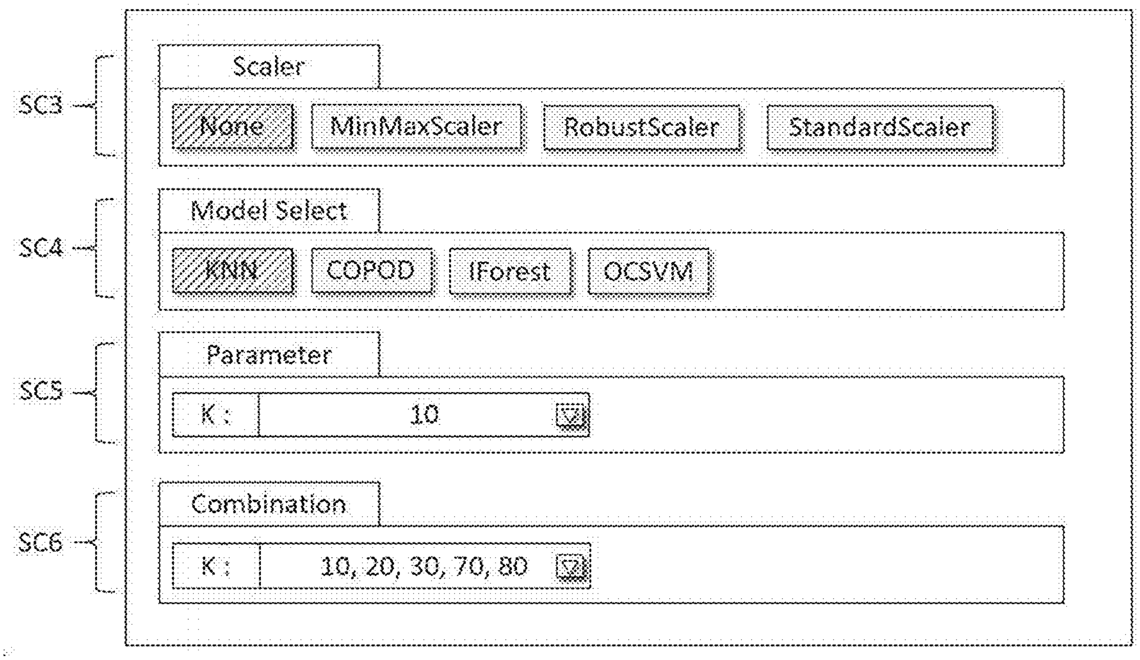

FIGS. 4B to 4D illustrate examples of user interface screens showing the setting of the determination model and the condition (S11) based on an embodiment.

In some implementations, the setting of the determination model and the condition S11 may include the following operations. In some implementations, the setting of the determination model and the condition (S11) may include providing first to fifth interface screens SC1 to SC5 to a user and receiving a user's selection. In the first interface screen SC1, a well log file stored in the storage unit 12 is selected, a position of a line displaying a unit of a feature is selected, and a value determined as null data is input. In the second interface screen SC2, each column where a name of a well, a depth, a record of whether or not there is a bad hole, and the input feature are positioned is selected as variables. In the third interface screen SC3, any one of a None, a MinMaxScaler, a RobustScaler, and a StandardScaler is selected as a scaler. In the fourth interface screen SC4, any one of a KNN, a COPOD, an Iforest, and am OCSVM is selected as a determination model. In the fifth interface screen SC5, a parameter of the determination model is input.

In some implementations, the setting of the determination model and the condition (S11) may include providing, to a user, an interface screen that provides selectable items and receiving an input from the user. The interface screen may include the first to the fifth interface screens SC1-5, and the interface screen may be provided as a single window or multiple windows. The determination model and the condition may be used to determine whether data of the well logs is a bad hole.

The processor 11 may provide the first interface screen (see reference numeral SC1 in FIG. 4B) that includes a file selection, a line position selection, and a value input. The first interface screen SC1 may include a file upload (File Upload) item, a preview (Preview) button, and an upload (Upload) button. In the file upload item, a user's selection may be input in a select file name (Select File name:) item, a unit (Unit:) item, and a null value (Null Value:) item. In the select file name item, a user may select a file to determine a bad hole from well log files stored in the storage unit 12. Two or more files may be selected. In FIG. 4B, a state in which the well-log-data1.CSV file and the well-log-data2.CSV file are selected is illustrated. As a file format, a known format used to store well logs may be used.

In the unit item, the user may designate a line that displays a unit of features included in well logs. As a line number increases, a depth of data of the well logs increases, and data of different features are recorded for each line number. In the unit item, the line in which a unit of features in data of well logs is displayed is designated. In FIG. 4B, 1 is selected in the unit item. That is, the user selected 1, and accordingly, the units of features are displayed in the first line of the well logs.

In the null value item, the user may input a value to be determined as null data. The null data is a section in which a value is not measured during a drilling exploration process. For example, since there is no oil and gas from a surface of the earth to a predetermined depth, collecting data from the surface of the earth to the predetermined depth is not meaningful. Therefore, data may not be recorded from the surface of the earth to the predetermined depth. That is, a line in which null data that does not have measurement data may exist. A value designated as null data may be different depending on a well log measurement method during a well logging process. In order to distinguish the line in the well logs where the null data exists, the user may input a value determined as the null data. In FIG. 4B, selecting −9999 in the null value item indicates that −9999 is input as the null data in the well log file selected by the user.

The user may select a file, may select a position of a line displaying units of features, may enter a value to be determined as null data, and may select a preview button. When the preview button is selected, the processor 11 may display data of some lines per file on the first interface screen SC1 for a user's review. The data displayed on the first interface screen SC1 may be output in five upper and lower lines for each file. After the user checks the data displayed on the first interface screen SC1, the user may select the upload button if there is no problem. When the upload button is clicked, the processor 11 may display the 'Data Uploading Completed' message on the first interface screen SC1.

When the file is uploaded, the processor 11 may provide the second interface screen (see reference numeral SC2 in FIG. 4C) in which variables are input. The second interface screen SC2 may include a variable selecting (Select Variables) item and an apply (Apply) button. In the select variables item, a user's selection may be input in a well (WELL:) item, a depth (DEPTH:) item, a bad hole (BH:) item, and an input feature (Input Features:) item.

In the well item, a column including a name of a well in the well log data may be selected. In FIG. 4C, selecting the 'Well-A1' in the well item indicates that the well log named 'Well-A1' is selected. In the depth item, the column including a depth in the well log data may be selected. In FIG. 4C, selecting the 'Well-B12' in the depth item indicates that the name of the column in which the depth is recorded is the 'Well-B12' and the user selects the 'Well-B12' column. In the bad hole item, a column in which a bad hole mark is to be recorded in the well log data may be selected. In FIG. 4C, selecting the 'BH-C2' in the depth item indicates that the name of the column in which whether or not the bad hole exists is recorded is the 'BH-C2' and the user selects the 'BH-C2' column. In the input features item, a column including features to be improved may be selected in various features in the well log data. In the input features item, multiple features may be selected. In FIG. 4C, selecting the 'NPHI' item and the 'RHOB' item in the input features item indicates that the user selects a column in which the 'NPHI' and the 'RHOB' are recorded. The 'NPHI' indicates neutron porosity. The 'RHOB' indicates a bulk density. Various features are recorded in each column in the well log data, and the user may select columns in which features to be improved are recorded.

When a user selects the well item, the depth item, the bad hole item, and the input features item and then the apply button is selected, the processor 11 may display the number of lines that do not include null data in any of input features. The number of lines that do not include the null data may be displayed for each file. In the second interface screen SC2, displaying the '[well-log-data1] The number of samples: 0' indicates that the number of lines that do not include the null data in the features of 'NPHI' and 'RHOB' in the 'well-log-data1' file is zero. In the second interface screen SC2, displaying the '[well-log-data2] The number of samples: 15257' indicates that the number of lines that do not include the null data in the features of 'NPHI' and 'RHOB' in the 'well-log-data2' file is 15257. In the quality controlling S10, in order to determine whether or not a bad hole exists, a model is trained by using a line in which null data does not exist in the input features. Therefore, the number of lines that does not have the null data may be checked and may be displayed to the user.

The processor 11 may provide the third interface screen (see reference numeral SC3 in FIG. 4D) in which a scaler is selected. The scaler may include the None, the MinMaxScaler, the RobustScaler, and the Standardscaler. Various features included in the well log data have various absolute value ranges. Therefore, the scaler is used to normalize the distribution of the values of the features in order to minimize the influence of absolute values on the analysis. The None is a setting in which original data is used without applying the scaler. The MinMaxScaler is a setting in which a variable is converted to a value between 0 and 1 and used. The RobustScaler is a standardization method, and is a setting in which a median and a quantile are used. The StandardScaler is a standardization method, and is a setting in which an average value and a standard deviation are used.

The third interface screen SC3 may include a None button, a MinMaxScaler button, a RobustScaler button, and a StandardScaler button. The third interface screen SC3 may receive a user's selection in a method other than using the buttons. The user may select any one of the scalers. When the user selects the scaler, the value of the column selected as input features in the well log data may be normalized according to the selected scaler.

The processor 11 may provide the fourth interface screen (see reference numeral SC4 in FIG. 4D) in which a determination model is selected. The determination model may include KNN, COPOD, IForest, and OCSVM. The fourth interface screen SC4 may include a KNN button, a COPOD button, an Iforest button, and an OCSVM button. The user may select a determination model by selecting a button. The user may select at least one determination model in multiple determination models.

Alternatively, the selecting of the determination model may be omitted, and all determination models may be set to be selected. When all determination models are set to be selected, the fourth interface screen SC4 in which the determination models are selected may be omitted.

In the KNN (K-nearest neighbor), a BH_score (Bad Hole Score) may be calculated by using information of a distance between K nearest neighbors.

The COPOD (COPula-basedOutlierDetection) uses a multiple variable cumulative distribution function called Copula that is used to express a dependency between random variables. The COPOD uses the Copula to estimate a tail probability of data. Here, the tail probability is a probability that corresponding data belongs to a tail section in a distribution. It can be interpreted that the more the data belongs to the tail section, the less likely the data is to occur. In input features values, data belonging to the tail section is unlikely to occur, so that the data can be determined as a bad hole.

The IForest (Isolated Forest) generates a decision tree on the basis of a random value of an input factor that is randomly selected. In addition, this process is repeated until each data becomes a terminal node. Furthermore, a forest is formed by generating a plurality of such decision trees. Generally, since data belonging to a terminal node that is closer to a root node is abnormal data, it can be determined that the data is a bad hole.

Unlike a conventional Support Vector Machine (SVM), the OCSVM (One Class Support Vector Machine) estimates an optimal support vector and a hyperplane that can best describe the data with an unsupervised method. Here, a non-linear decision boundary is formed by using a kernel function, and a bad hole score (BH_score) may be calculated by using a distance between the boundary and the data.

The processor 11 may provide the fifth interface screen (see reference numeral SC5 in FIG. 4D) in which a parameter of the determination model is input. The parameter is a hyperparameter of each determination model. In the KNN model, a parameter is the number of nearest neighbors to be used. The COPOD model does not use a parameter. In the IForest model, a parameter is the number of decision trees constituting the forest. In the OCSVM model, a parameter is a kernel coefficient of a kernel function constituting the non-linear decision boundary.

In the fifth interface screen SC5, items for inputting parameters may be displayed differently according to the selection of the determination model. For example, in FIG. 4D, in the item for inputting a parameter, only the K: item that is the parameter of the KNN model is displayed to be input. This is because the user selects only the KNN in the fourth interface screen SC4. When another determination model is further selected, more items for inputting parameters may be displayed.

The processor 11 may provide a sixth interface screen (see reference numeral SC6 in FIG. 4D) in which multiple parameters are input. The sixth interface screen SC6 may include a combination item. In the combination item, multiple parameters may be input from the user at once. The result of the determination model is different according to the parameters. By inputting multiple parameters at once, multiple determination models having different parameters may be generated, and analysis results of the multiple determination models may be acquired at once. In the sixth interface screen SC6 in FIG. 4D, inputting 10, 20, 30, 70, and 80 in the K: item indicates that the user inputs five values as KNN parameters.

Some embodiments of the disclosed technology will be described with reference to FIGS. 2 and 3. After the determination model and the condition are input, the processor 11 may perform the analyzing of the well logs S12. In some implementations, the analyzing of the well logs S12 may include analyzing the well logs according to the determination model and the condition, and determining whether or not data is a bad hole. In some implementations, the analyzing of the well logs S12 may include, in response to multiple parameters that are simultaneously input in the sixth interface screen SC6 where parameter of a determination model is input, generating each determination model for the multiple parameters at once, and integrating and displaying the results. In some implementations, the analyzing of the well logs S12 may include analyzing input features values in an unsupervised learning method according to input conditions, and providing an analysis result for determining which value is determined as an outlier.

Figure 5A:
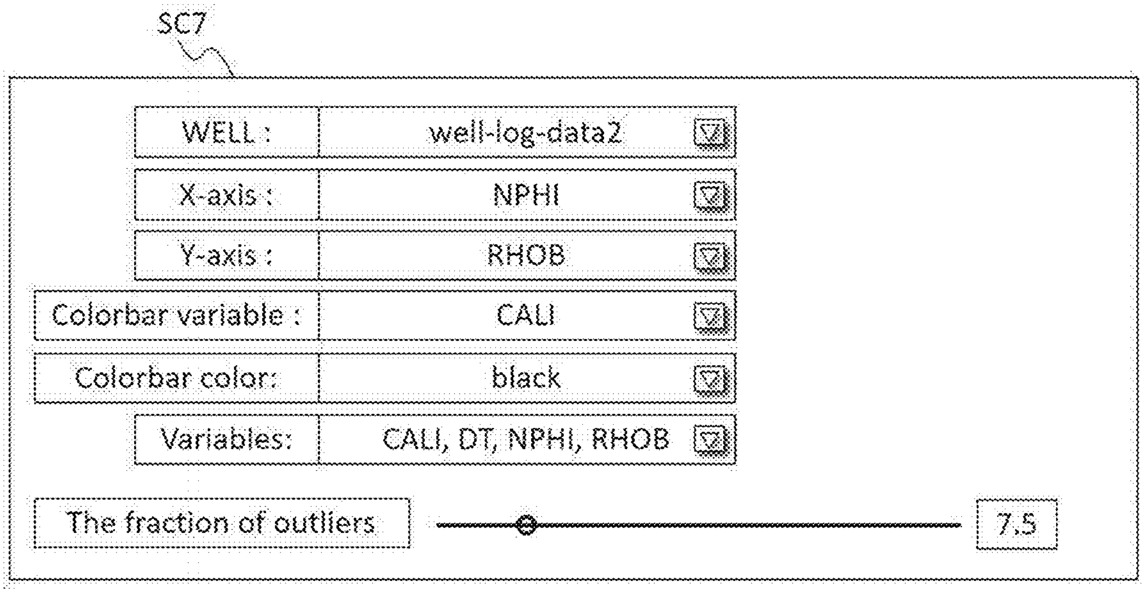
FIG. 5A illustrates an example of an interface screen showing setting a visualization condition based on an embodiment.
Figure 5B:
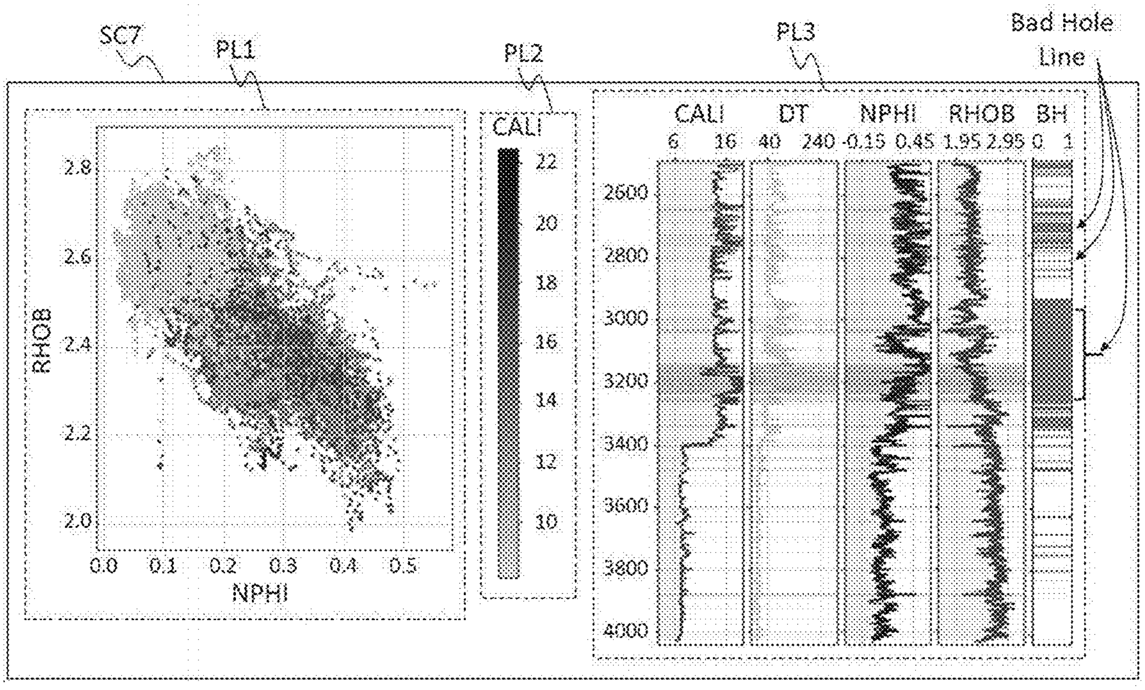
FIGS. 5B and 5C illustrate graphs visualizing bad hole determination results of a well log based on an embodiment.
Figure 5C:
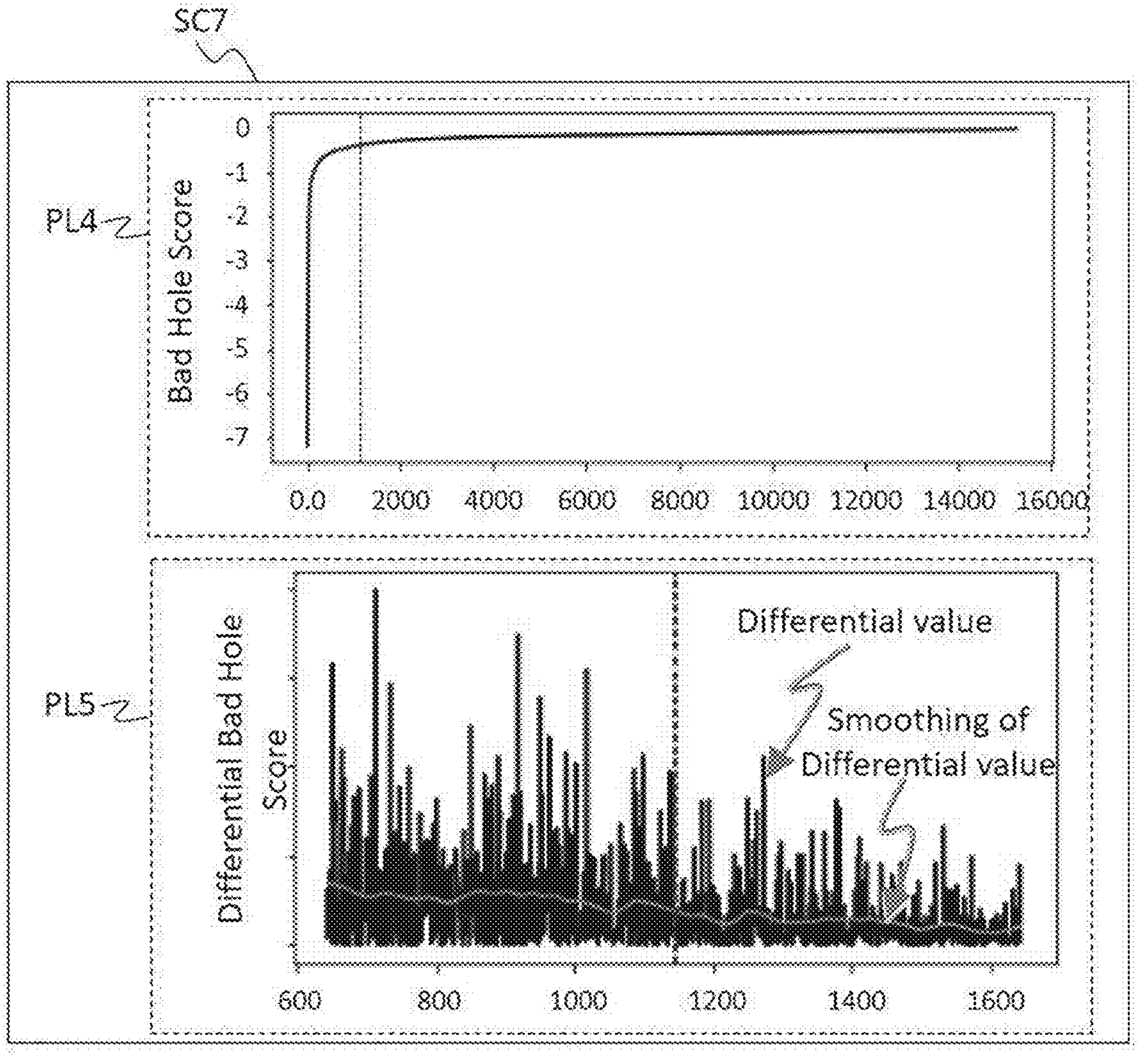

FIG. 5A illustrates an example of a user interface screen that sets a visualization condition based on an embodiment. FIGS. 5B and 5C illustrate graphs visualizing bad hole determination results of the well logs based on an embodiment. Seventh interface screens illustrated in FIGS. 5A to 5C may be displayed as a single screen.

In some implementations, the displaying of the section determined as the bad hole (S13) may include visually displaying an analysis result. In some implementations, the displaying (S13) may include displaying of the section include at least one of a cross-plot in which data are displayed as points according to features of the X-axis and features of the Y-axis, a depth-plot in which the section determined as the bad hole for features selected as input features, and a bad hole score plot in which bad hole scores are sorted from a small value to a large value, a line graph is drawn, and a point where a slope rapidly changes is displayed.

The seventh interface screen SC7 may receive at least one input in a well (WELL:) item, an X-axis (X-axis:) item, a Y-axis (Y-axis:) item, a colorbar variable (Colorbar variable:) item, a colorbar color (Colorbar color:) item, a variable (Variable:) item, and a fraction of outliers (The fraction of outliers) item. Furthermore, the seventh interface screen SC7 may display at least one of a cross-plot PL1, a colorbar PL2, a depth-plot PL3, a bad hole score plot PL4, and a differential bad hole score plot PL5.

The well item is a portion for selecting an analysis result to be visualized in a graph, and a well log file name may be selected. In FIG. 5A, the 'well-log-data2' file is selected as the well item, and the result of analyzing the selected file with the determination model may be visualized. In the X-axis item, an input feature to be displayed on the X-axis of the cross-plot may be selected. In the Y-axis item, an input feature to be displayed on the Y-axis of the cross-plot may be selected. It can be seen that the 'NPHI' is selected as the X-axis item and the 'RHOB' is selected as the Y-axis item in FIG. 5A, and it can be seen that the 'NPHI' is displayed on the X-axis of the cross-plot and the 'RHOB' is displayed on the Y-axis of the cross-plot in FIG. 5B. In the colorbar variable item, an input feature to be displayed on the colorbar may be selected. In the colorbar color item, a colorbar color may be selected. It can be seen that 'CALI' is selected as the colorbar variable item and 'black' is selected as the colorbar color item in FIG. 5A, and it can be seen that the 'CALI' is displayed in 'black' color in the color bar. The 'CALI' indicates a caliper. In the variables item, input features to be displayed on the depth-plot may be selected. It can be seen that the 'CALI', 'DT', the 'NPHI', and the 'RHOB' are selected as the variables item in FIG. 5A, and it can be seen that the 'CALI', the 'DT', the 'NPHI', and the 'RHOB' are displayed on the cross-plot in FIG. 5B. The 'DT' is an abbreviation of 'Delta Time', and indicates an acoustic log or a sonic log.

The fraction of outlier item may be configured as a slide bar. In the fraction of outliers item, when the slide bar is moved, a value corresponding to a position of a point may be displayed on the slide bar. In the fraction of outlier item, when the user moves the slide bar, criteria for determining a bad hole may change. When the user changes the fraction of outlier item by moving the slide bar, bad hole sections displayed in the cross-plot PL1, the depth-plot PL3, the bad hole score plot PL4, and the differential bad hole score plot PL5 may change in real time.

For example, the slide bar may adjust a ratio of a section determined as a bad hole in the entire section. In the fraction of outlier item, when the slide bar is moved, the number of lines displayed as bad holes in the plots displayed on the seventh interface screen SC7 may change. In the fraction of outlier item, when the slide bar is moved so that the corresponding value is increased or decreased, the number of lines determined as outliers may be increased or decreased. When the ratio of a section that is determined as a bad hole is set to a small size, the number of outliers is decreased, so that the data determined as the bad hole may be decreased. When the ratio of a section that is determined as a bad hole is set to a large size, the number of outliers is increased, so that the data determine as the bad hole may be increased.

The user may check how bad holes are distributed in the well log data with a simple operation by variously selecting the cross-plot, the depth-plot, the colorbar, and the fraction of outlier item on the seventh interface screen.

The processor 11 may display an analysis result in at least one of the cross-plot PL1, the colorbar PL2, the depth-plot PL3, the bad hole score plot PL4, and the differential bad hole score plot PL5. The cross-plot PL1, the colorbar PL2, the depth-plot PL3, the bad hole score plot PL4, and the differential bad hole score plot PL5 may be displayed on a single screen, so that the user may check the analysis results at a glance.

The cross-plot PL1 is a plot in which data are displayed as points according to the input feature of the X-axis and the input feature of the Y-axis. In the cross-plot PL1, a distribution seen in general rocks and a distribution of the bad hole data may be confirmed by distributions of two input features. By the cross-plot PL1, data that is outside a general distribution may be checked, and a section with a good data quality even though the section is a bad hole section may be checked. The bad hole section at this time may be a bad hole section that is generated when a diameter of a drilling hole is larger than a diameter of a drill bit.

The colorbar PL2 is a plot displaying the selected input feature in a gradient manner of the selected color.

The depth-plot PL3 is a plot displaying data determined as a bad hole for the selected input features. The depth-plot PL3 may be displayed as a normal scale or a log scale. In the depth-plot PL3, lines determined as bad holes for various input features may be checked. A vertical axis of the depth-plot PL3 indicates a value of a depth. A horizontal axis of the depth-plot PL3 is values of input features. In the depth-plot PL3, values of input features according to a depth level are visually displayed, so that distributions of the values of the input features in bad hole sections may be checked. In the depth-plot PL3, bad hole sections determined as bad holes may be displayed as bad hole lines, and the bad hole lines may be displayed in a different color. In the depth-plot PL3, bad holes and values of the input features according to the depth are visually displayed. In the seventh interface screen SC7, a change in bad hole sections may be checked while changing input features.

The bad hole score plot PL4 is a knee plot in which a line graph is arranged sequentially from a small value to a large value and a point at which a slope rapidly changes is indicated by a dotted line. The differential bad hole score plot PL5 is a plot displaying a differential value of a bad hole score. In the differential bad hole score plot PL5, a differential value and a smoothed differential value of the bad hole score may be displayed. The bad hole score may be acquired in all determination models, and the user may check a change in the bad hole section by moving the slide bar in the fraction of outlier item.

Some embodiments of the disclosed technology will be described with reference to FIG. 4. The processor 11 may perform the merging of the results S14. In the merging of the results S14, merging the results of determining the bad hole section with various conditions for one well log into one data is performed.

Figure 6A:
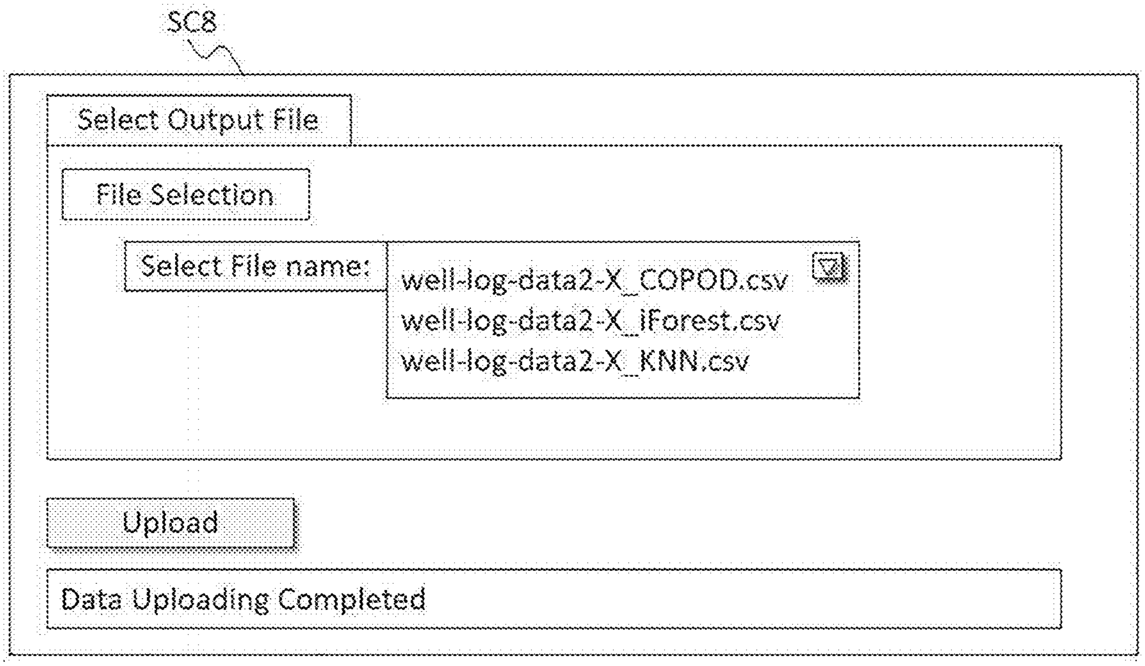
FIG. 6A illustrates an example of an interface screen in which a result file for merging a well log is loaded based on an embodiment.
Figure 6B:
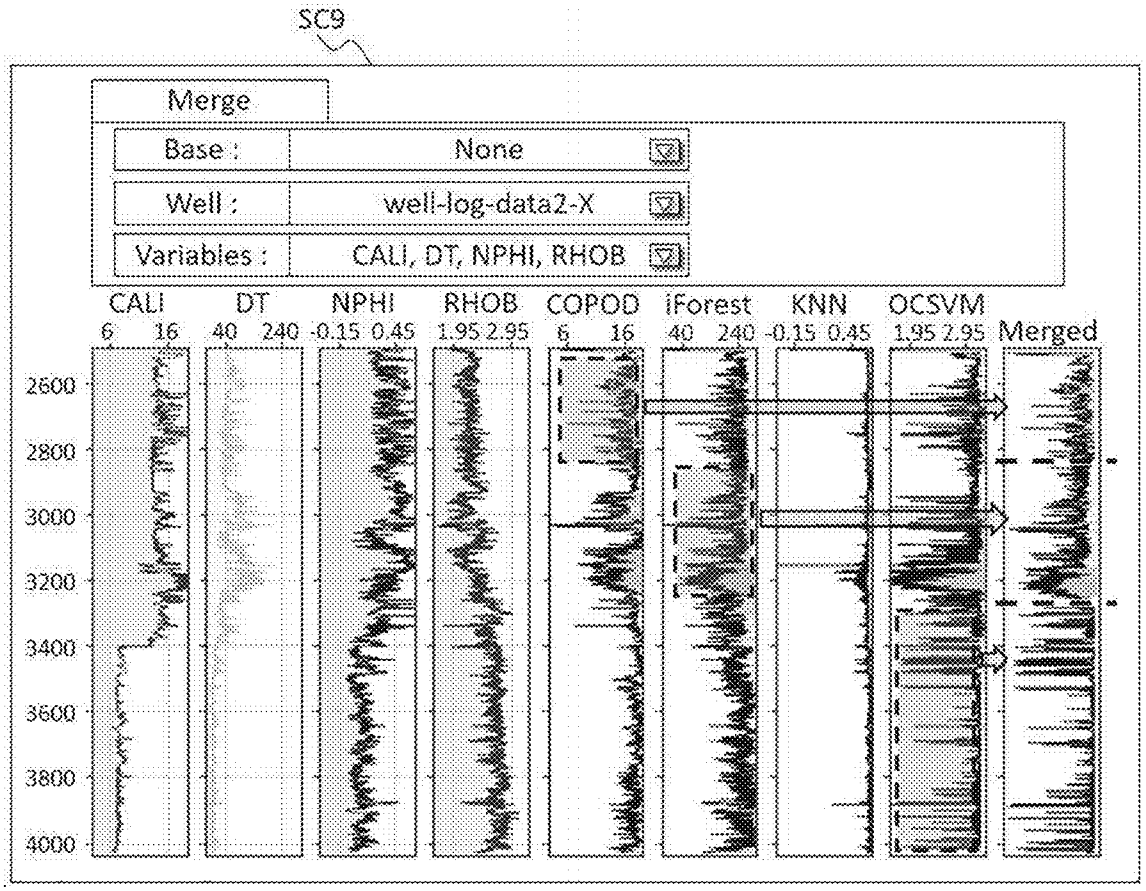
FIG. 6B illustrates an example of an interface screen in which bad hole determination results of a well log are merged based on an embodiment.

FIG. 6A illustrates an example of an interface screen in which a result file for merging a well log is loaded based on an embodiment. FIG. 6B illustrates an example of an interface screen in which bad hole determination results of the well log are merged based on an embodiment. In FIG. 6B, a drag region is shaded.

In the merging of the results S14, the processor 11 may provide an eighth interface screen SC8 in which an analysis result file to be merged is uploaded, and may provide a ninth interface screen SC9 in which multiple depth-plots are displayed on a single screen then a fraction of the well log is selected in the depth-plots and then a selected region is merged into a single well log.

In the eighth interface screen SC8, a result file to be merged may be selected in a select file name (Select File name:) item. The user may select multiple result files. In FIG. 6A, 'well-log-data2-X_COPOD.csv', 'well-log-data2-X_iForest.csv', and 'well-log-data2-X_KNN.csv' are selected in the select file name item, and it can be seen that the user has selected three result files, and that each result file is the result analyzed by the COPOD model, the iForest model, and the KNN model. When the user selects an upload (Upload) button, the processor 11 may display the message 'Data Uploading Completed'.

In the ninth interface screen SC9, a base (Base:) item, a well (Well:) item, and a variable (Variables:) item may be input in a merge (Merge) item. In the base item, an analysis result file that is the basis for merging. When an arbitrary analysis result file is selected in the base item, the determination results may be merged by overwriting the bad hole determination section selected from the user in the corresponding analysis result file. When the base item is not selected, fractions of multiple analysis results may be selected and merged into a single analysis result. In the well item, an analysis result file displayed in a depth-plot is selected. Since 'well-log-data2-X' is selected as the well item, the depth-plot displays the result of analyzing the 'well-log-data2-X'.

In some implementations, the merging of the results (S14) may include displaying multiple results determining the bad hole sections in depth-plots, and generating a bad hole determination result by reflecting an area selected from the depth-plots in a merged depth-plot.

Depth-plots may display various input features and results according to various determination models. In FIG. 6B, depth-plots of four input features (CALI, DT, NPHI, and RHOB) are displayed, and analysis results of four determination models (COPOD, iForest, KNN, and OCSVM) are displayed.

When a different condition and a different determination model are used, a different bad hole determination result may be generated. In addition, when different input features are used, a different bad hole determination result may be generated. The user may check multiple depth-plots in one screen that displays bad hole determination results in which different conditions and different determinations are used, and may select a portion to be reflected in the merged depth-plot by dragging the portion. The processor 11 reflects a portion of the depth-plot selected by the user (dotted line box and shade) in the merged depth-plot. In the merged depth-plot, portions determined as bad holes in different conditions and different determination models may exist together.

The user may select the bad hole determination result file that is the basis of merging, and may select input features as a variable. When the user's selection is completed, the processor 11 may display depth-plots according to the corresponding features, the corresponding condition, and the corresponding determination model. The processor 11 may provide a function for the user to enlarge or reduce a graph, and may provide an interface in which the portion dragged by the user in the depth-plot is displayed in a different color and the portion is reflected in the merged depth-plot when a predetermined key is pressed. In the merged depth-plot, one bad hole determination result in which multiple determination results are combined may be displayed. The merged depth-plot generated by merging portions of multiple determination results by the user may be saved as a final bad hole analysis result.

Through this process, the user may easily determine the bad hole section existing in the well logs in a comprehensive and consistent manner. In addition, since the user receives the bad hole determination result that is visualized, the user may easily determine whether or not the bad hole exists.

Figure 7A:
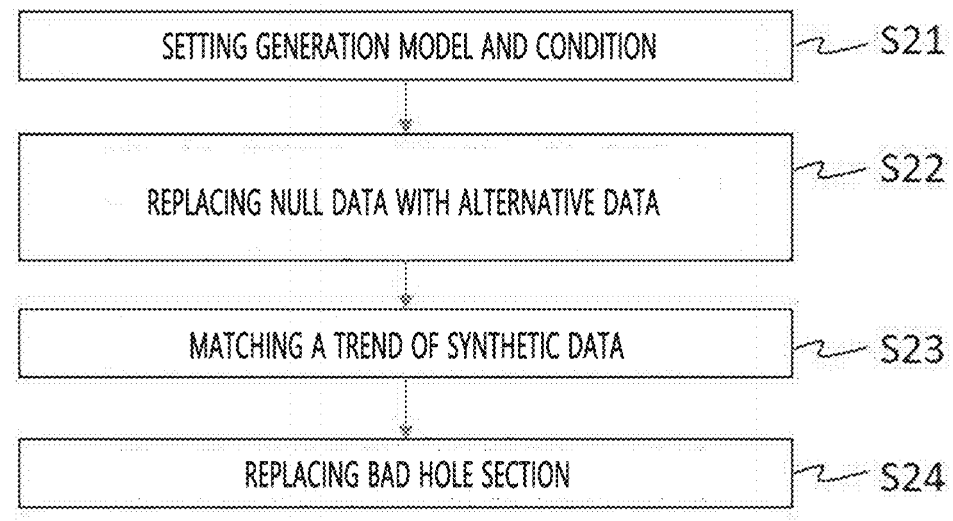
FIG. 7A is a flowchart illustrating an example that performs conditioning in an embodiment.

FIG. 7A is a flowchart illustrating an example that performs conditioning S20 based on an embodiment.

The conditioning operation (S20) will be described. The conditioning operations (S20) may include, at S21, setting a condition and a generation model for generating alternative data, at S22, replacing null data of well logs with the alternative data by generating the alternative data using the generation model and the condition are used and reflecting a depth trend, at S23, matching a trend of synthetic data generated using an empirical formula to trend of the well log replaced with the alternative data by adjusting the synthetic data using an auto trend matching method, and at S24, replacing a bad hole section of the well logs with the synthetic data that is adjusted.

Figure 7B:
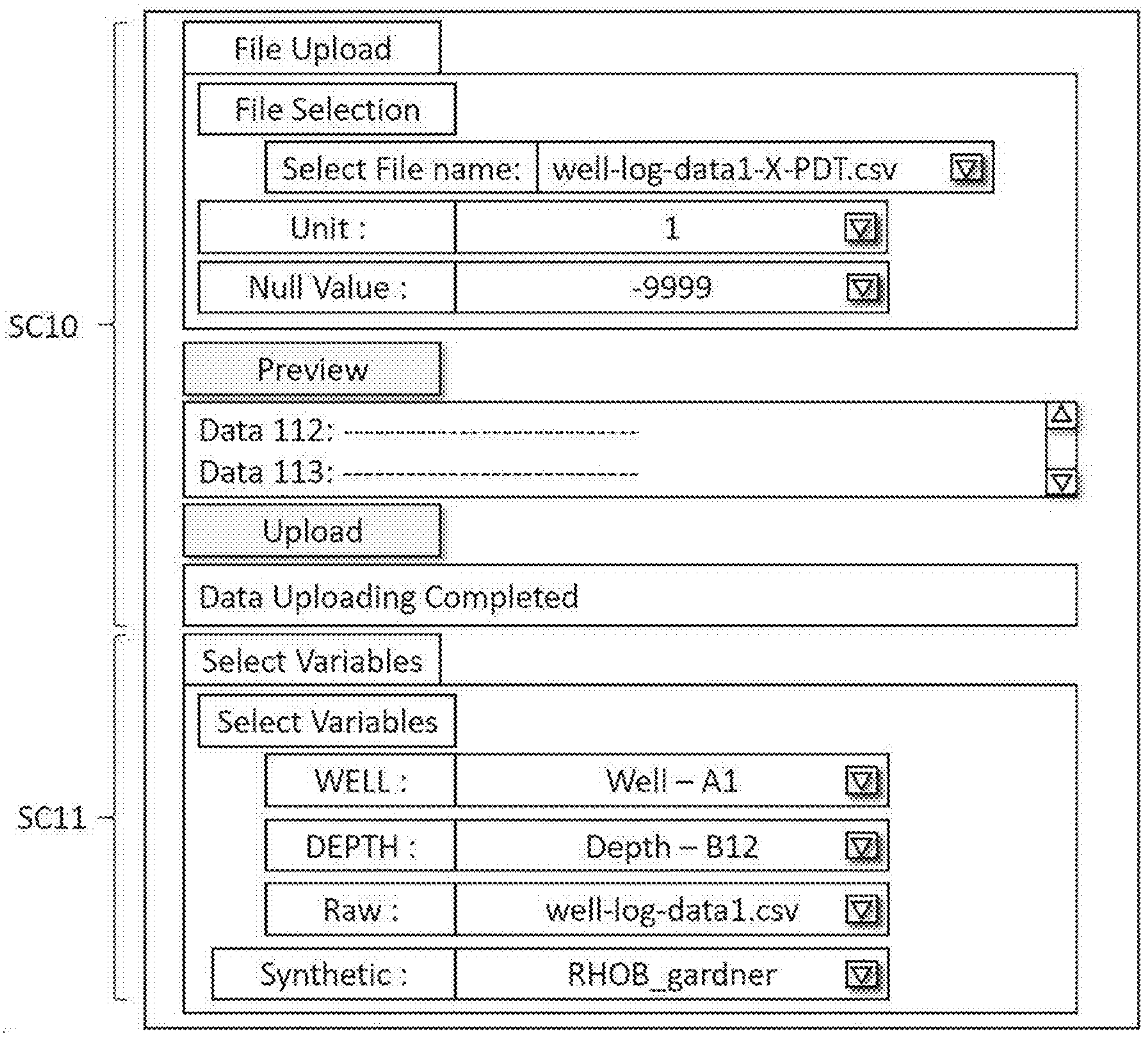
FIGS. 7B to 7D illustrates examples of interface screens showing setting a generation model and a condition based on an embodiment.
Figure 7C:
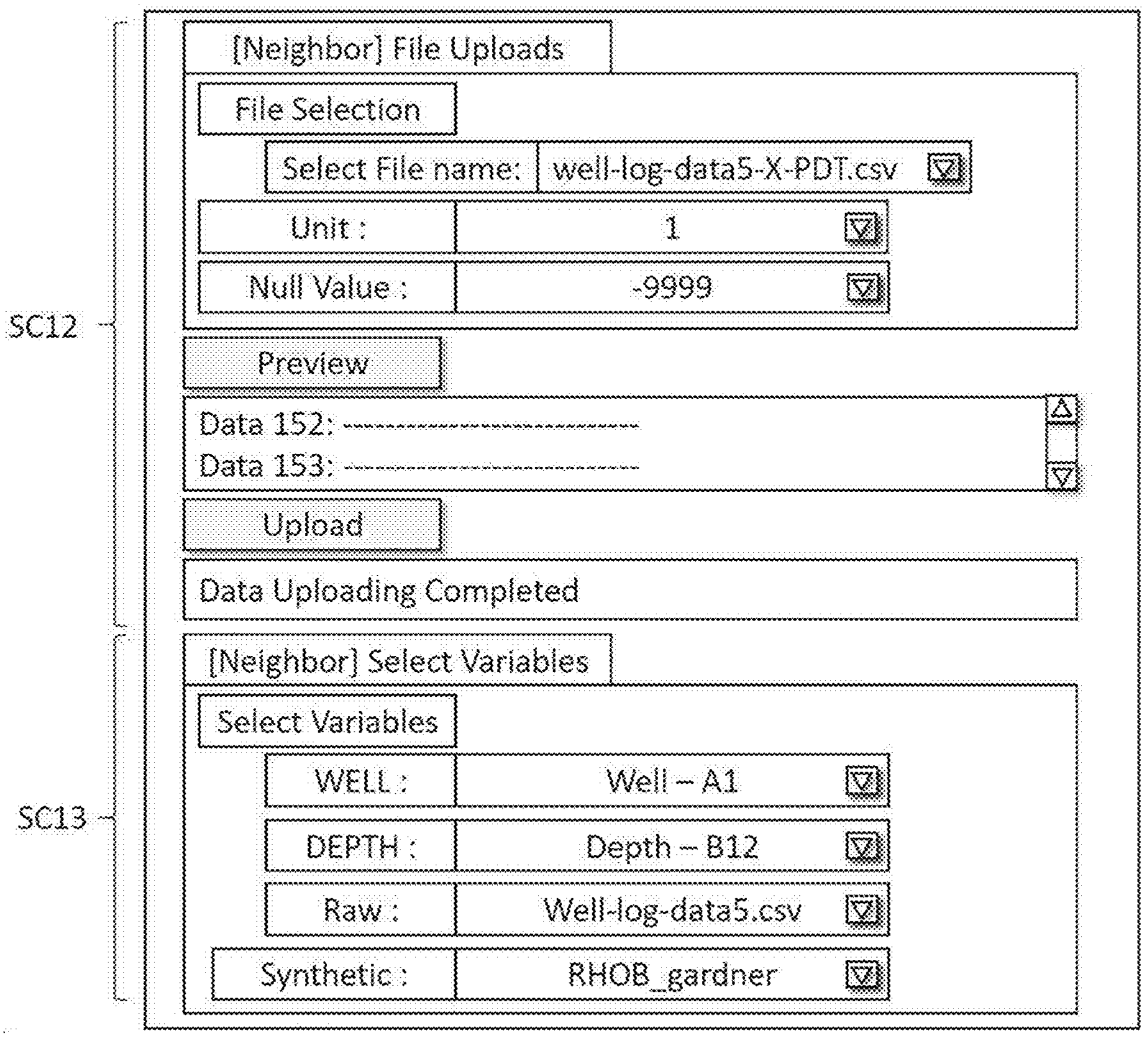
Figure 7D:
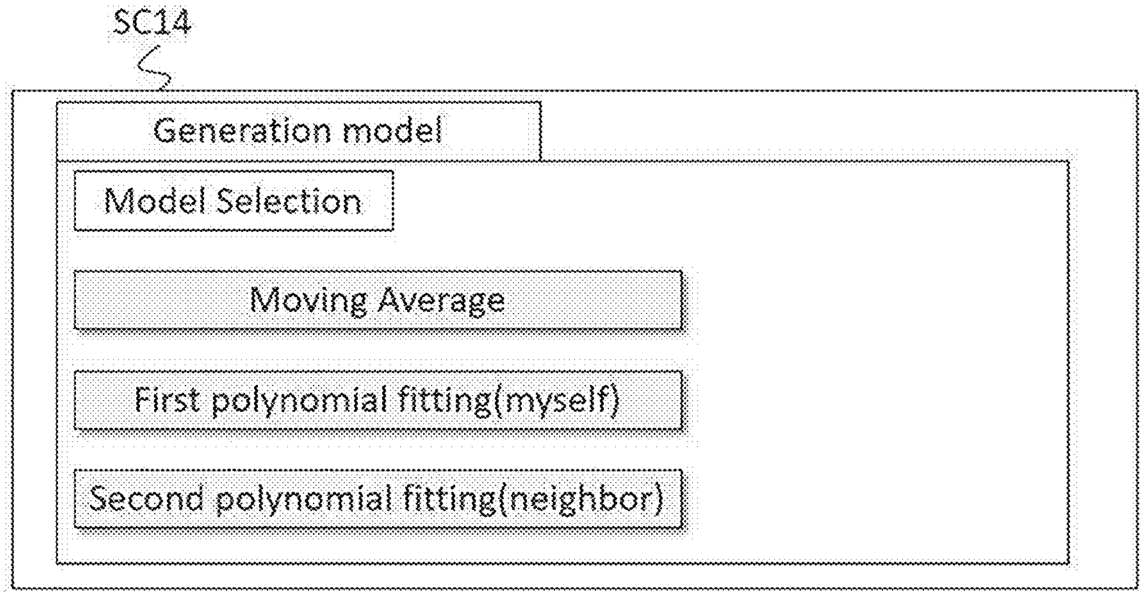

FIGS. 7B to 7D illustrates examples of interface screens showing the setting of the generation model and the condition S21 based on an embodiment. A tenth interface screen SC10 and an eleventh interface screen SC11 in FIG. 7B may be provided as independent screens. A twelfth interface screen SC12 and a thirteenth interface screen SC13 in FIG. 7C may be provided as independent screens.

In some implementations, the setting of the generation model and the condition (S21) may include selecting, by the user, the generation model and the condition. In some implementations, the setting of the generation model and the condition (S21) may include receiving, by the processor 11, a well log file, a unit, a null value for performing conditioning through the tenth interface screen SC10 by the user, and performing, by the processor 11, a preview process and an upload process. A file selected in a select file name (Select File name:) item is a well log file to perform conditioning. Since the tenth interface screen SC10 is similar to the first interface screen SC1 in FIG. 4B, a repeated description will be omitted.

In some implementations, the setting of the generation model and the condition (S21) may include providing, by the processor 11, to the user, the eleventh interface screen SC11 in FIG. 7B. In a select variable (Select Variables) item, a user's selection of a well (Well:) item, a depth (Depth:) item, a raw (Raw:) item, and a synthetic (Synthetic:) item may be input. Since the description of the well item and the depth item are similar to the description of the well item and the depth item in the second interface screen in FIG. 4C, a detailed description will be omitted. The raw item is a portion in which a file corresponding to an original file of well log data is selected. Selecting 'well-log-data1' in the raw item indicates that a well log file that is an original file of a 'well-log-data1-X_PDT' file is the 'well-log-data1'. The synthetic item is a portion in which a file corresponding to feature values generated by the user by using an empirical formula. The user may generate feature values by using a method such as 'DT_Faust' or 'RHOB_gardner'. Selecting the 'RHOB_gardner' in the synthetic item indicate that feature values generated by the user by using the 'RHOB_gardner' method.

The twelfth interface screen SC12 and the thirteenth interface screen SC13 in FIG. 7C are almost identical to the tenth interface screen SC10 and the eleventh interface screen SC11 respectively, and the difference is that a well log file and a condition of a neighbor well for reference to process null data when conditioning is performed. Therefore, when data of the neighbor well is required to process the null data, the user may input data and a condition of the neighbor well by using the twelfth interface screen SC12 and the thirteenth interface screen SC13.

A fourteenth interface screen SC14 in FIG. 7D is a screen in which how to generate newly generated data to replace the null data of the well logs is selected. In the fourteenth interface screen SC14, a generation model may be input. A model selection item includes a moving average (Moving Average) button, a first polynomial fitting (myself) (First polynomial fitting (myself)) button, and a second polynomial fitting (neighbor) (Second polynomial fitting (neighbor)) button. The user may select at least one button.

The moving average is a method of generating alternative data replacing the null data by acquiring a moving average within an original well log file. The first polynomial fitting (myself) is a method of generating alternative data replacing the null data by using a polynomial fitting method within an original well log file in the same manner as the method in the moving average. The second polynomial fitting (neighbor) is a method of generating alternative data replacing the null data by using a polynomial fitting method after a depth trend is trained from other well logs by using the polynomial fitting.

Figure 8:
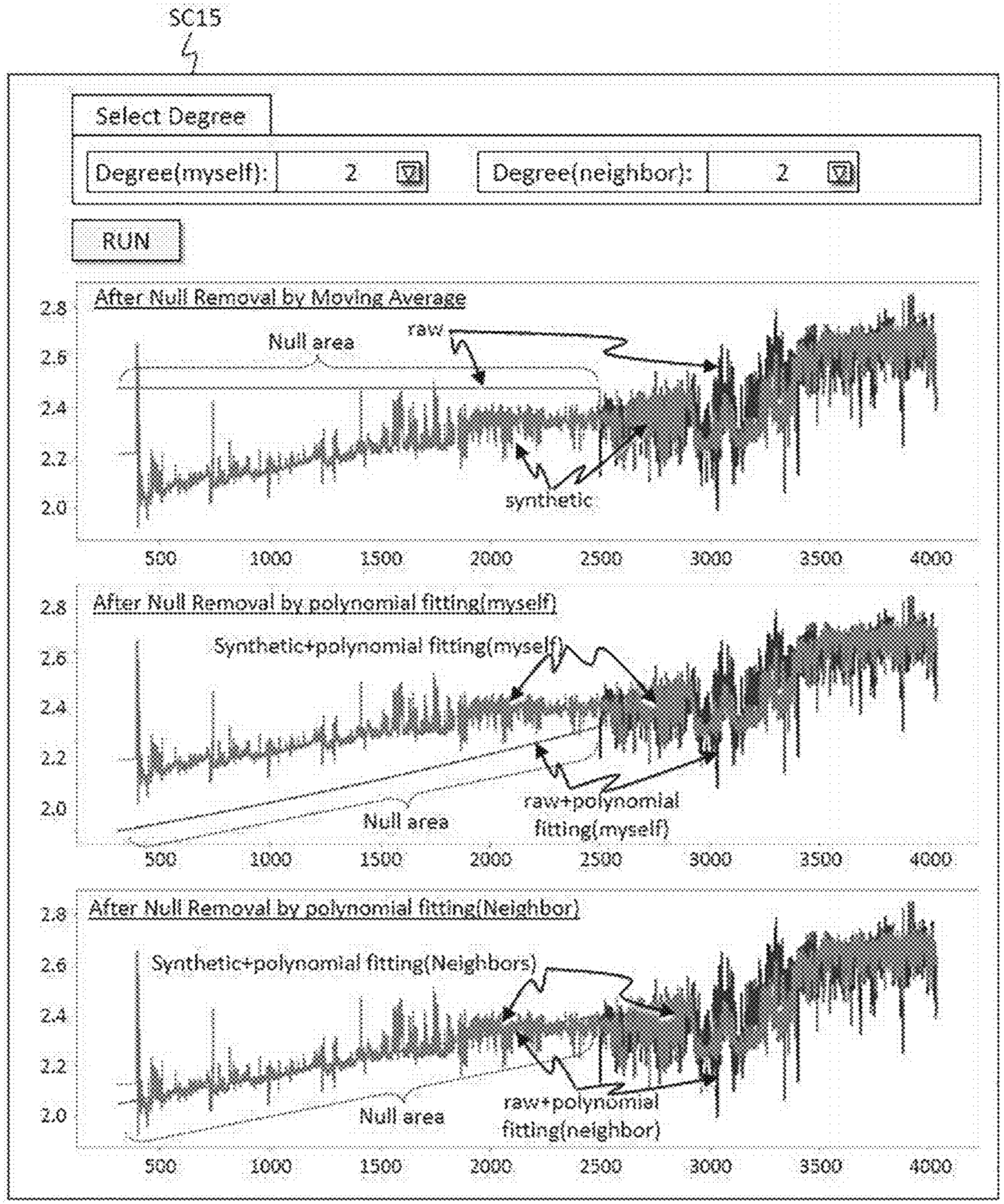
FIG. 8 illustrates an example that replaces null data with alternative data based on an embodiment.

FIG. 8 illustrates an example that replaces the null data with the alternative data S22 based on an embodiment.

In some implementations, the replacing of the null data with the alternative data (S22) may include generating the alternative data capable of replacing the null data in the well logs by using the condition and the generation model that are input.

The replacing of the null data with the alternative data may include any one of a first operation in which a moving average as a generation model is used for generating the alternative data by using data that is not the null data of the well logs and then replacing the null data with the alternative data, a second operation in which the first polynomial fitting as a generation model is used for generating the alternative data in which a depth trend trained from data that is not the null data of the well logs is reflected and then replacing the null data with the alternative data, and a third operation in which the second polynomial fitting as a generation model is used for generating the alternative data by reflecting the depth trend trained from data that is not the null data of a neighbor well log and by using data that is not the null data of the well log, and then by replacing the null data with the alternative data.

In some implementations, the replacing of the null data with the alternative data (S22) may include the processor 11 may receive a degree of the polynomial fitting through a fifteenth interface screen, and may display a plot that displays synthetic data together with the result in which the null data is replaced with the alternative data.

In a select degree (Select Degree) item, the number of items in the polynomial fitting may be input. A degree (myself) (Degree (myself)) item indicates the number of items in the first polynomial fitting. A degree (neighbor) (Degree (neighbor)) item indicates the number of items in the second polynomial fitting. In FIG. 8, the degree value of 2 indicates that the user has selected to perform the polynomial fitting by using two items. When the degree of the polynomial fitting is selected, an over-fitting may occur when the number of items is large, and the depth trend is not well reflected when the number of items is small, so that the user may select an appropriate degree of the polynomial fitting.

When the user selects a run (RUN) button in the fifteenth interface screen, the processor 11 generates alternative data on the basis of the selected generation model and the selected condition, in which the alternative data is reflected with the depth trend on the basis of the data that is not the null data, and the processor 11 inputs the alternative data replacing the null data to the well log. The processor 11 may visually display the result of performing the replacing of the null data with the alternative data S22 in a plot. Here, the synthetic data generated by an empirical rule and the original well log in which the null data is replaced with the alternative data may be displayed together.

The alternative data may be generated such that a change in features values that vary according to the depth of the well logs is reflected. The alternative data may be generated by using the generation model.

Some embodiments of the disclosed technology will be described with reference to an 'After Null Removal by Moving Average' plot in FIG. 8. A horizontal axis of the plot indicates a depth.

A null area (Null area) is a section in which the null data existed. The null area may be present to a predetermined depth that is close to the surface of the earth. Since an area close to the surface of the earth is unnecessary data in oil and gas exploration, a measurement may not be performed due to the efficiency of exploration. Therefore, a value does not exist or is recorded as a constant value in the well logs, and such data may be the null data. Such null data is required to be replaced with the alternative data for comprehensive analysis.

The moving average is a method of generating the alternative data replacing the null data by acquiring a moving average by using data (e.g., data having values in a normal range) that is not the null data in the original well log file selected in the raw item. In the plot, 'raw' is a replacement of the null data in the original well log with the alternative data generated by using a moving average model. It can be seen that the 'raw' is displayed as a straight line in the null area when an area other than the null data is averaged in the original well log. That is, it can be seen that the alternative data in the null area is displayed as the straight line when the moving average method is used. On the other hand, it can be seen that a sloped trend according to the depth in the null area occurs since 'synthetic' that is the synthetic data is generated by the empirical method.

A center plot in FIG. 8 illustrates a state in which the polynomial fitting is applied to the original well log, and it can be seen that the straight line section has sloped values since the null data is corrected according to the depth. The center plot in FIG. 8 illustrates the alternative data generated by using a polyfit (myself), and it can be seen that a trend of the generated data has a slope such as the null data having a slope.

Some embodiments of the disclosed technology will be described with reference to an 'After Null Removal by polynomial fitting (myself)' plot in FIG. 8. A horizontal axis of the plot indicates a depth.

The first polynomial fitting is a method of performing the polynomial fitting and training a depth trend by using data (that is, data having values in a normal range) that is not the null data in the original well log file selected in the raw item, and then generating the alternative data replacing the null data. In the plot, 'raw+polynomial fitting (myself)' is data in which the null data of the original well log is replaced with the alternative data generated by using the first polynomial fitting. Since areas other than the null data in the original well log show a trend having a value that is large as the depth becomes deeper, it can be seen that the 'raw+polynomial fitting (myself)' has a trend sloped according to the depth. That is, it can be seen that the depth trend is reflected in the alternative data of the null area when the first polynomial fitting is used. It can be seen that 'synthetic+polynomial fitting (myself)' in which the first polynomial fitting is performed to the synthetic data displayed together has the depth trend that the data generated by the empirical rule has. However, in the null area, it can be seen that the depth trend of the 'synthetic+polynomial fitting (myself)' and the depth trend of the 'raw+polynomial fitting (myself)' are different from each other.

Some embodiments of the disclosed technology will be described with reference to an 'After Null Removal by polynomial fitting (neighbor)' plot in FIG. 8. A horizontal axis of the plot indicates a depth.

The second polynomial fitting is a method of performing the polynomial fitting and training a depth trend by using data (that is, data having values in a normal range) that is not the null data in the neighbor well log file selected by using the twelfth and the thirteenth interface screens in FIG. 7C, and then generating the alternative data replacing the null data of the original well log. In the plot, 'raw+polynomial fitting (neighbor)' is data in which the null data of the original well log is replaced with the alternative data generated by using the second polynomial fitting. In the null area, the depth trend of the 'raw+polynomial fitting (neighbor)' may be generated according to the depth trend trained from the data of the neighbor well log. That is, it can be seen that the depth trend of the neighbor well log is reflected in the alternative data of the null area when the second polynomial fitting is used. 'Synthetic+polynomial fitting (neighbor)' in which the second polynomial fitting is performed to the synthetic data displayed together is generated by correcting data generated by the empirical rule according to the depth trend of the neighbor well log. Since the 'synthetic+ polynomial fitting (neighbor)' and the 'raw+polynomial fitting (neighbor)' follow the depth trend of the same neighbor well log, it can be seen that depth trends are similar in the null area.

The second polynomial fitting best reflects the depth trend in generating the alternative data replacing the null data, but there is a limit that other well logs are required. When the null data is sparsely scattered, the moving average and the first polynomial fitting show similar performance. However, when the null data is continuously positioned on a specific section, the first polynomial fitting may more stably generate the alternative data replacing the null data.

Figure 9:
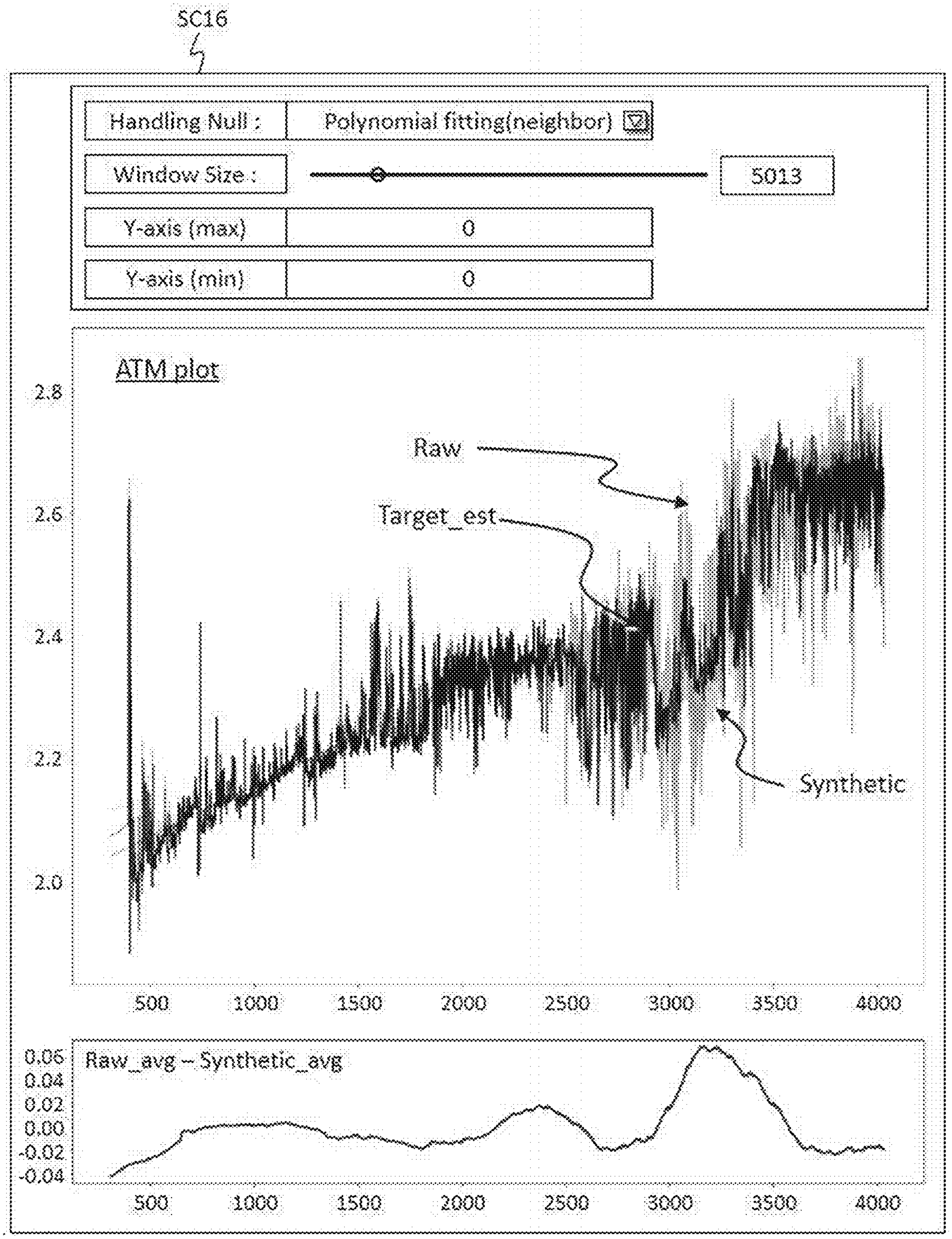
FIG. 9 illustrates an example that adjusts synthetic data by using an auto trend matching based on an embodiment.

FIG. 9 illustrates an example that adjusts the synthetic data by using the auto trend matching S23 based on an embodiment.

In the process of adjusting the synthetic data S23, adjusting the value of the synthetic data so that the trend of the synthetic data is similar to the trend of the well log where the null data is replaced with the alternative data is performed. By adjusting the value of the synthetic data, the trend of the synthetic data may be adjusted to have a similar shape to the trend of the well log in which the null data is replaced with the alternative data.

In the adjusting of the synthetic data S23, the processor 11 is capable of receiving input of a handling null (Handling Null:) item, a window size (Window Size:) item, a Y-axis maximum value (Y-axis (max)) item, and a Y-axis minimum value (Y-axis (min)) item, and the processor 11 may provide a sixteenth interface screen SC16. In the sixteenth interface screen SC16, an ATM plot in which the original well log, the synthetic data, and the adjusted synthetic data are displayed is displayed, and a Raw_avg-Synthetic_avg plot in which a difference between the moving average trend of the original well log and the moving average trend of the synthetic data is shown is displayed.

The handling null item is an item in which a method for replacing the null data is selected. In the handling null item, at least one of the moving average, the first polynomial fitting, and the second polynomial fitting may be selected. Displaying 'polynomial fitting (neighbor)' in the handling null item indicates that the user has selected the second polynomial fitting method as the method for replacing the null data.

The window size item displays a slide bar and a value of the window size. The value of 5013 is displayed as the window size value in FIG. 9. When the user moves the slide bar, the window size value changes. The window size is a window size used in the acquiring of the moving average of the auto trend matching.

The Y-axis maximum value item may receive the maximum depth value displayed in the ATM plot and the 'Raw_avg-Synthetic_avg' plot. The Y-axis minimum value item may receive the minimum depth value displayed in the ATM plot and the 'Raw_avg-Synthetic_avg' plot. The ATM plot and the 'Raw_avg-Synthetic_avg' plot display values corresponding to depth values between the Y-axis minimum value and the Y-axis maximum value.

The user may change the values of the window size item, the Y-axis maximum value item, and the Y-axis minimum value item, and may find an appropriate window size value to which the trend is matched.

The adjusting of the synthetic data S23 may include acquiring a trend of the well log replaced with the alternative data by using the moving average method, acquiring a trend of the synthetic data generated from the empirical formula by using the moving average method, and matching the trend of the synthetic data with the trend of the well log replaced with the alternative data by adjusting a window size of a moving average.

The processor 11 may acquire the trend of the well log replaced with the alternative data by using the moving average method, may acquire the trend of the synthetic data by using the moving average method, and may display a difference between the trend of the well log replaced with the alternative data and the trend of the synthetic data in the 'Raw_avg-Synthetic_avg' plot. By referring to the 'Raw_avg-Synthetic_avg' plot, the user may adjust the window size and may determine the window size in which the overall difference in the trends is small may be determined. When the user adjusts the window size, 'Target_est' displayed in the ATM plot is also changed. The 'Target_est' indicates a value in which the synthetic data is adjusted by the auto trend matching. In the ATM plot, 'Raw' indicates a value of the well log replaced by the alternative data, and 'Synthetic' indicates a value of the synthetic data. The user may determine an appropriate window size by comparing both the 'Raw' and the 'Synthetic' to the Target_est' that varies depending on the change in the window size.

When the window size is determined, the user may save the 'Target_est' as result data of the auto trend matching.

Figure 10:
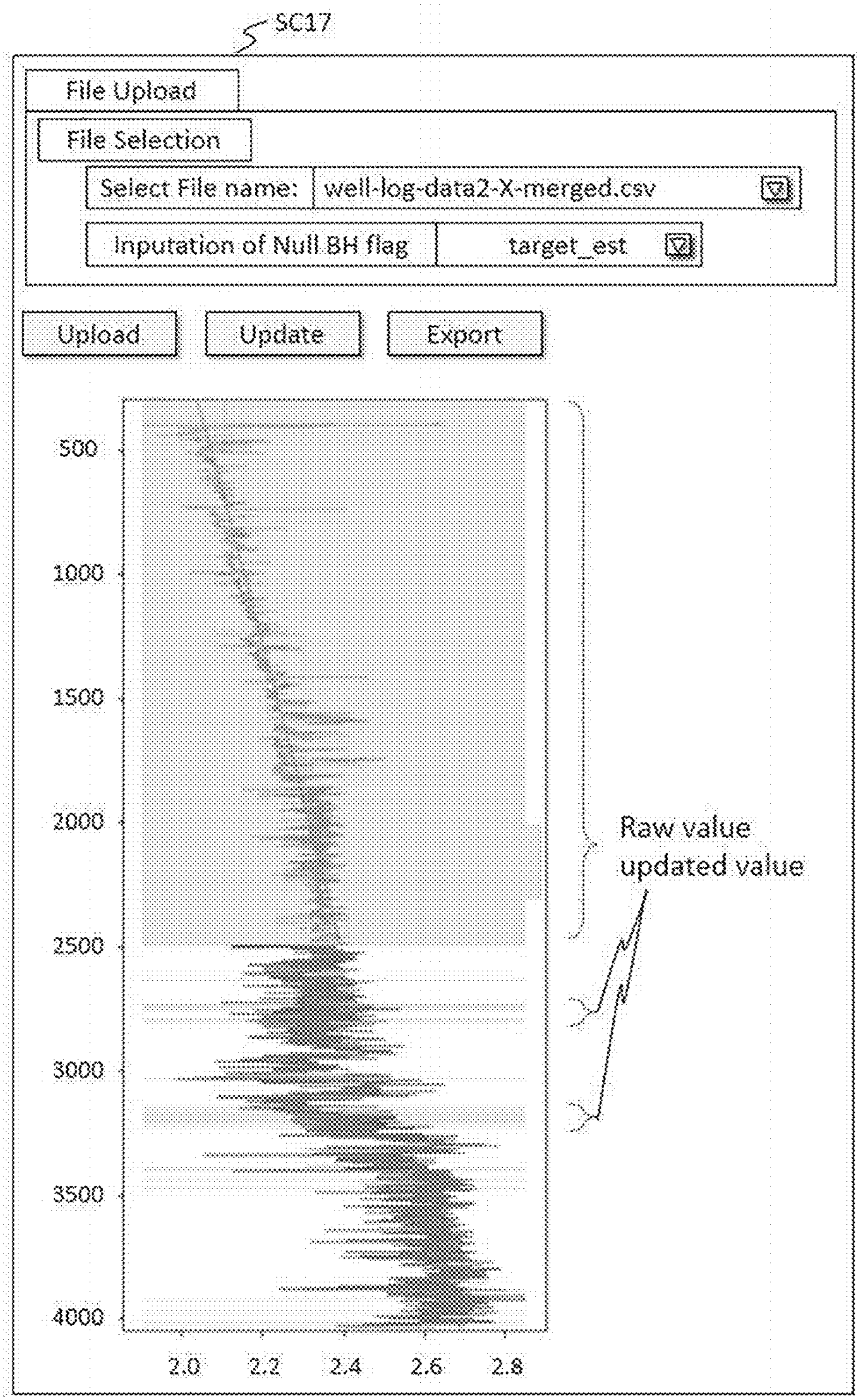
FIG. 10 illustrates an example that replaces a bad hole section with alternative data based on an embodiment.

FIG. 10 illustrates an example that replaces the bad hole section with the alternative data S24 based on an embodiment.

The performing conditioning S20 may include the replacing of the bad hole section with the alternative data S24. In the replacing of the bad hole section with the alternative data S24, the processor 11 may select a file in which the bad hole determination result is merged, may select and upload a 'target_est' file that is synthetic data in which a depth trend adjusted, and may provide a seventeenth interface screen. The seventeenth interface screen includes an upload (Upload) button, an update (Update) button, and an export (Export) button, and displays a plot representing the merged bad hole determination result, the original well log, and the adjusted synthetic data.

In a file selection (File Selection) item, a well log file in which the bad hole determination result is merged and saved may be selected in a select file name (Select File name:) item. Selecting a 'well-log-data2-X-merged' file in the select file name item indicates that a well log file in which the bad hole analysis results of the well log are combined and saved is selected. An imputation of null bad hole flag (Imputation of Null BH flag) item is an item to select which data to fill a portion that is not the bad hole in the well log. In the column where the bad hole determination result is recorded, 1 may be recorded when the column is determined as the bad hole and Null may be recorded when the column is not the bad hole. Selecting a 'target_est' file in the imputation of null bad hole flag item indicates that the synthetic data in which the auto trend matching is performed is selected.

When a file is selected then the upload button is selected and then the update button is selected, the value of the selected file is displayed on the plot.

In the plot, in a portion (a portion in which a BH column value is 1) determined as the bad hole, a gray shade is displayed, normal data is displayed instead of the null data, and the alternative data replacing the null data and reflecting the depth trend is displayed. In addition, the synthetic data in which the depth trend is reflected and the auto trend matching is performed is displayed. Since the null data and the bad hole section are inappropriate to be used as data for oil and gas exploration, the corresponding portion may be removed and may be replaced with the synthetic data in which the auto trend matching is performed. Since a portion that is not the null data and is not the bad hole is appropriate to be used as data for oil and gas exploration, the value of the original well log may be maintained. Alternatively, a portion that is not the null data and is not the bad hole may be replaced with a value of the synthetic data in which the auto trend matching selected in the imputation of null bad hole flag item is performed.

When the performing conditioning S20 is performed, the data determined as the bad hole and the null data in the well log may be removed, and the data may be replaced with the synthetic data in which the depth trend is reflected and the auto trend matching is performed. Here, the synthetic data is adjusted by using the auto trend matching method so that the synthetic data has the depth trend similar to that of the original well log. Therefore, a manual operation of the user may be minimized, and reproducible and consistent conditioning results may be acquired.

Figure 11A:
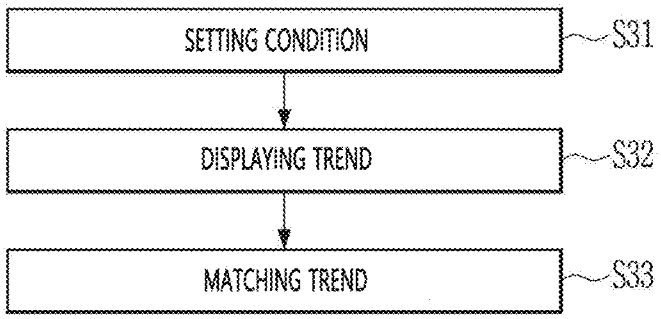
FIG. 11A is a flowchart illustrating normalizing based on an embodiment.

FIG. 11A is a flowchart illustrating the normalizing S30 based on an embodiment.

The normalizing S30 will be described. The normalization of the distribution of data of the well log S30 may include setting a condition for matching a data distribution of a target well log to a data distribution of a reference well log based on a condition and a trend for visualizing a well log S31, displaying a trend of the well log and a trend of the reference well log by using the condition S32, and matching the trend of the well log to the trend of the reference well log by adjusting the trend of the well log S33.

In some implementations, the normalizing S30 may include adjusting the data distribution of the well log so that the data distribution of the well log is similar to the data distribution of the reference well log. In some implementations, the setting of the condition (S31) may include selecting the reference well log and setting features and so on in which the data distribution is to be adjusted is performed. In some implementations, the displaying of the trends (S32) may include calculating the well log data in the moving average method then generating the trends and then visually displaying the trends are performed. The trend of the well log and the trend of the reference well log may be compared and displayed. The user may check the trend of the well log and the trend of the reference well log that are visually displayed, and may perform an appropriate normalization adjustment. In some implementations, the adjusting of the trends (S33) may include adjusting the trend of the well log so that the trend of the well log is matched to the trend of the reference well log. By adjusting the trend of the well log, the overall data of the corresponding features of the well log may be adjusted.

Figure 11B:
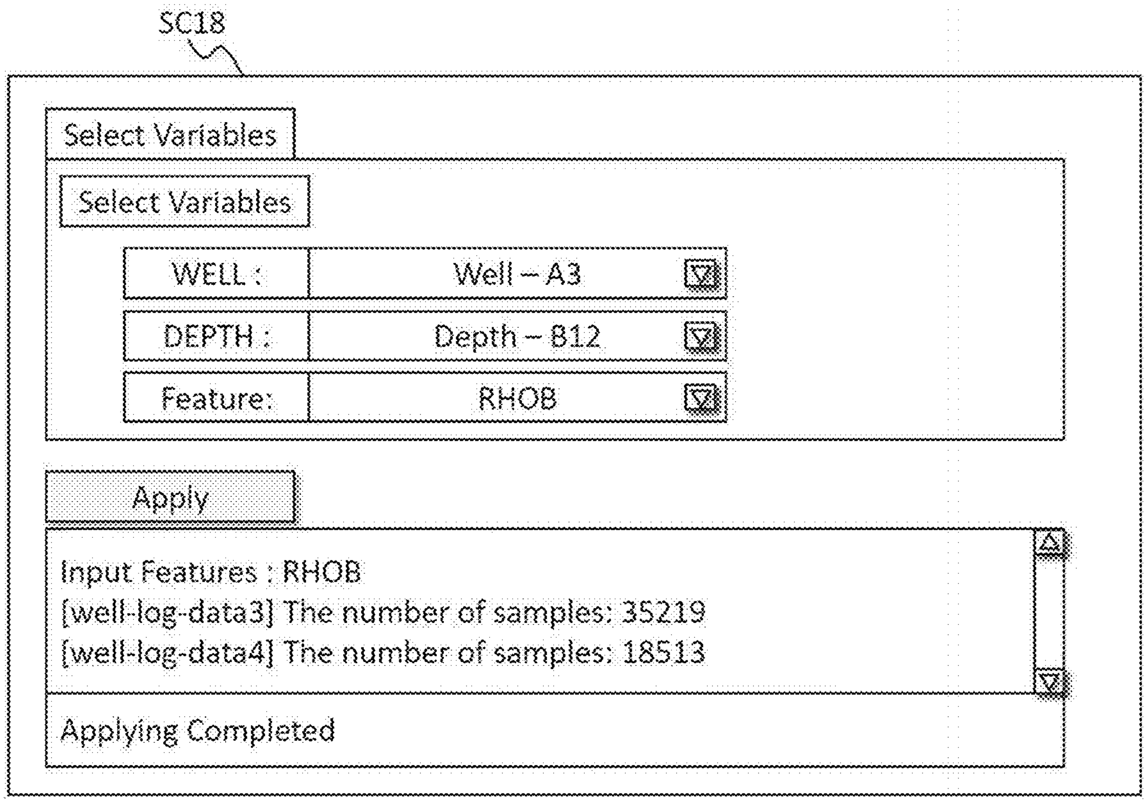
FIGS. 11B and 11C illustrates examples that set a condition based on an embodiment.
Figure 11C:
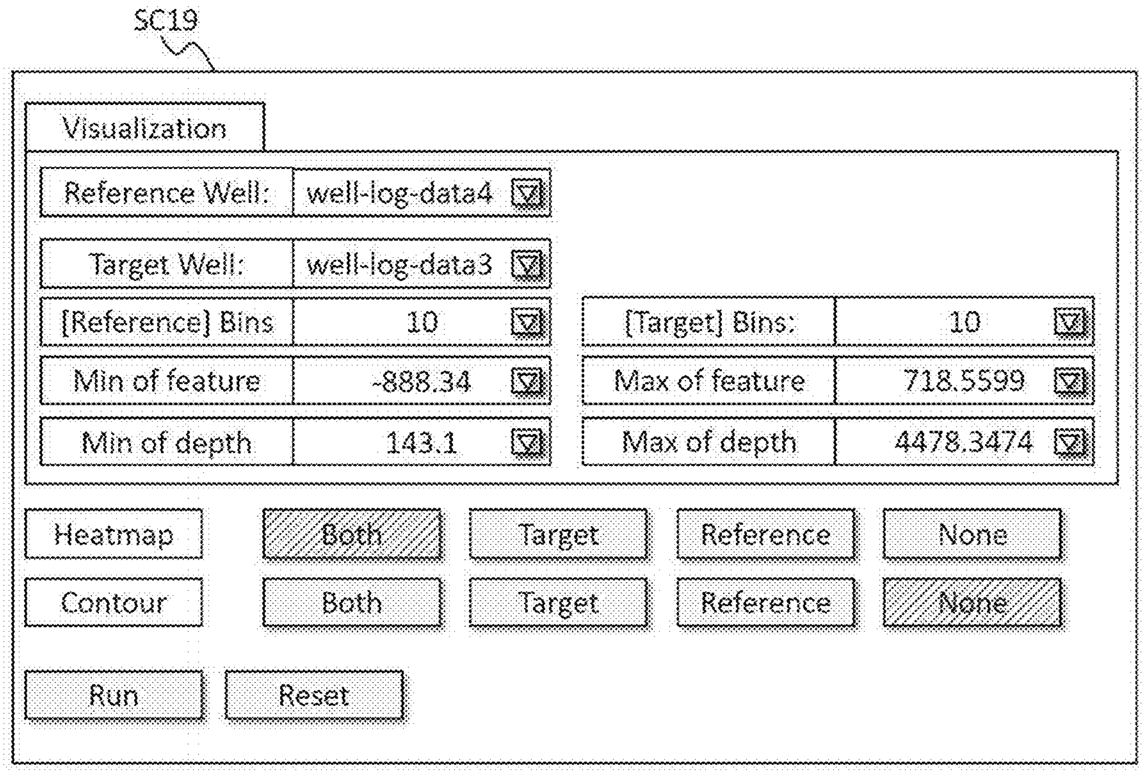

FIGS. 11B and 11C illustrates examples that set the condition based on an embodiment.

In some implementations, the setting of the condition (S31) may include: selecting, by the processor 11, the well log file and the reference well log file stored in the storage unit 12; selecting a line displaying units of the features; providing the first interface screen SC1 in FIG. 4B receiving the value determined as the null data; providing an eighteenth interface screen SC18 in FIG. 11B where a column name of a well, a column name of a depth, and input features are selected as variables; providing a nineteenth interface screen SC19 where the reference well log and the target well log are selected for visualization then a visualization type and a bin (Bins) value are input and then a range of features and a range of a depth to be visualized.

The processor 11 may select the well log file by using the first interface screen in FIG. 4B, and may receive variables by using the eighteenth interface screen in FIG. 11B. Since the description of the file selection and the input of the variable is already described with reference to FIGS. 4B and 4C, a repeated description will be omitted.

The processor 11 may provide the nineteenth interface screen SC19 in FIG. 11C, and may receive a condition required for visualization from the user. In the nineteenth interface screen SC19, a visualization (Visualization) item may receive input of a reference well (Reference Well:) item, a target well (Target Well:) item, a reference bin ([Reference] Bins) item, a target bin ([Target] Bins) item, a minimum value of a feature (Min of feature) item, a maximum value of a feature (Max of feature) item, a minimum value of a depth (Min of depth), and a maximum value of a depth (Max of depth).

In the reference well item, a well log file (reference well log) that is a target of trend adjustment may be input. In the target well item, a well log file (target well log) in which data is to be adjusted through normalization. The reference bin item and the target bin item may receive a resolution of a gradient as a number when the visualization is performed in a heatmap type. The minimum value of the feature item and the maximum value of the feature item may receive a range of feature data displayed on the plot. The minimum value of the depth item, the maximum value of the depth item may receive a range of depth data displayed on the plot.

In addition, the nineteenth interface screen SC19 may receive a visualization type by a both (Both) button, a target (Target) button, a reference (Reference) button, and a none (None) button when the heatmap type is selected. Furthermore, the nineteenth interface screen SC19 may receive a visualization type by a both (Both) button, a target (Target) button, a reference (Reference) button, and a none (None) button when a contour type is selected. In addition, the nineteenth interface screen SC19 may include a run (Run) button and a reset (Reset) button.

As a method of visualizing the data of the well log, the heat map type or the contour type may be selected. When both the buttons are selected in the heat map type, data of both the target and the reference well logs are displayed in the plot as a heat map type. When none of the buttons are selected in the contour type, data of both the target and the reference well logs are not displayed in the plot as a contour type. When the target button is selected in the contour type and the reference button is selected in the heatmap type, the target well log may be displayed in the plot as the contour type, and the reference well log may be displayed in the plot as the heatmap type. That is, the reference and the target well logs may be displayed in the contour type or the heatmap type according to the user's selection.

The heatmap is a method of expressing a density of data by a gradient of a color. The contour is a method of expressing a density of data in a contour without a color. Since the distribution of the data is different between the target and the reference well logs, the user may select the appropriate method according to the data. When the heatmap method is selected, a difference in a resolution of a gradient of a color may be set. When the bin is set to 10, a 10-stage gradient between an area in which the data is densest and an area in which the data is sparsest may be expressed.

The area displayed in the plot may be referred to as an area of interest. The area of interest may be determined by a range of minimum and maximum values of the features and a range of minimum and maximum values of the depth. When the minimum values and the maximum values are not input, the minimum values and the maximum values of the features and the depths of the target well log and the reference well log are used.

When all the conditions required for visualization are input and the run button is selected, the displaying of the trends S32 may be performed.

The displaying of the trends (S32) may includes: calculating the trend of the target well log and the trend of the reference well log by using the moving average method and displaying the trend of the target well log and the trend of the reference well log as plots based on the reference well log, the target well log, the visualization type, the bin value, the ranges of the features and the depths to be visualized that are input upon setting the condition S31. The trends may be generated by calculating the features data of the target well log and the reference well log in the moving average method according to a predetermined window size. In addition, the data of the reference well log and the target well log may be displayed as a heatmap type data plot or a contour type data plot according to a visualization type. The trend plots and the data plots are illustrated in FIG. 12B.

The user may check the trend plots and the data plots, may check the data distributions of the reference well log and the target well log, and may check a difference in the trends. The user may acquire an idea about a direction in which the normalization is to be performed through the visualized plot.

Figure 12A:
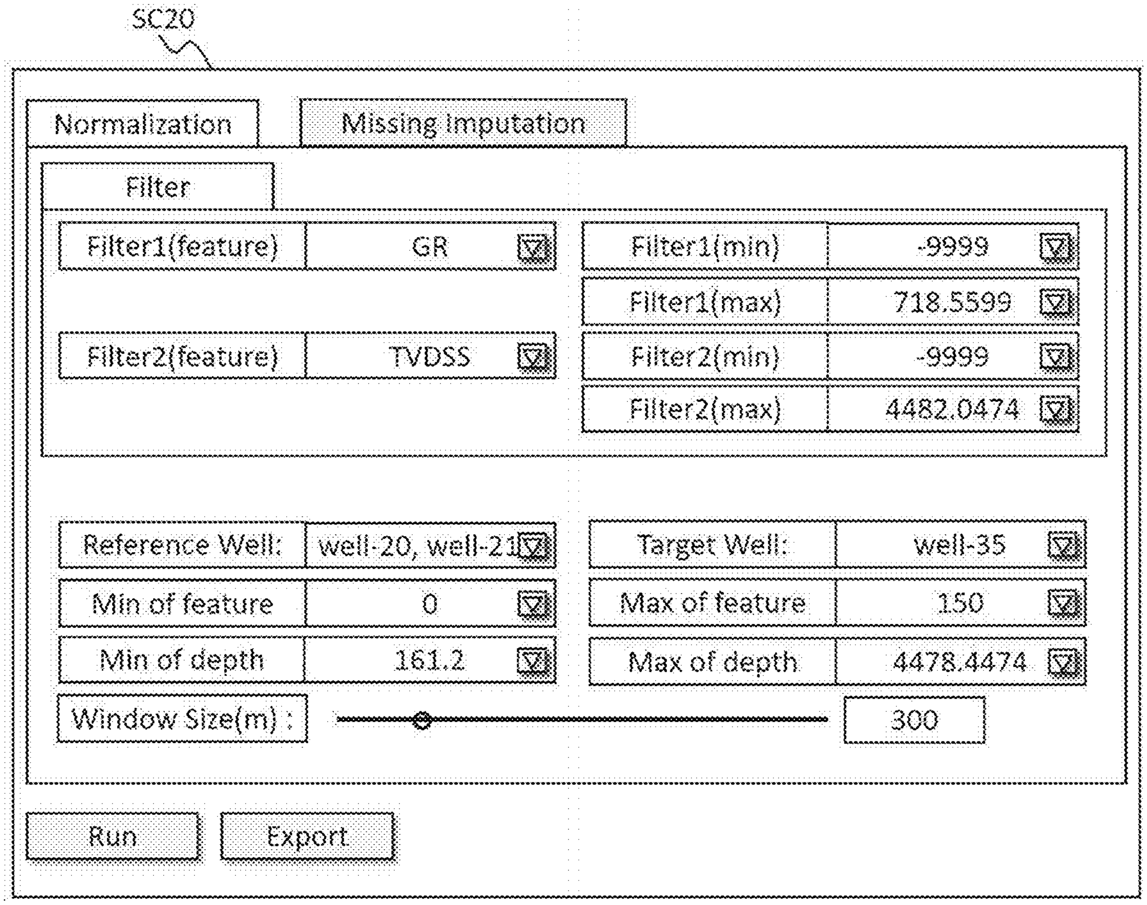
FIG. 12A illustrates an example of an interface screen in which the condition is input to adjust a trend based on an embodiment.
Figure 12B:
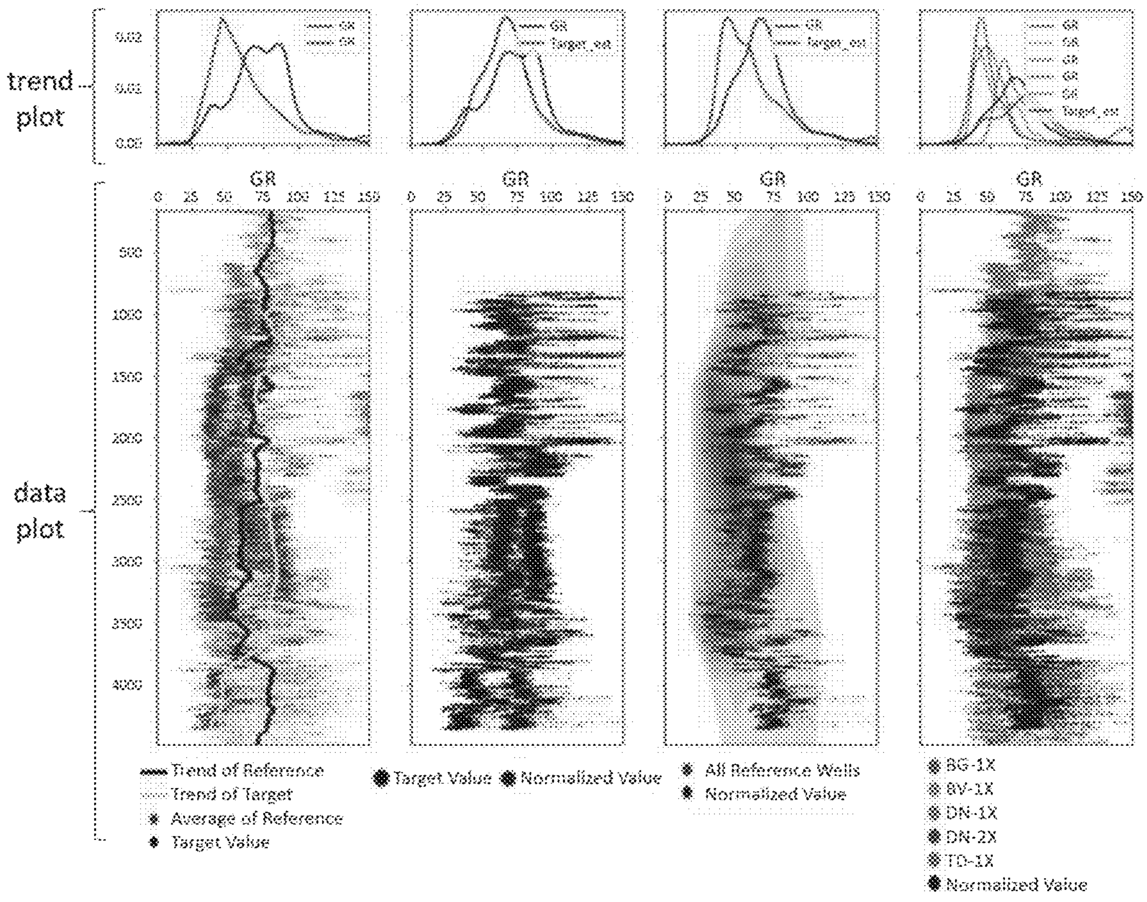
FIG. 12B illustrates plots of a target well log and a reference well log based on an embodiment.
Figure 12C:
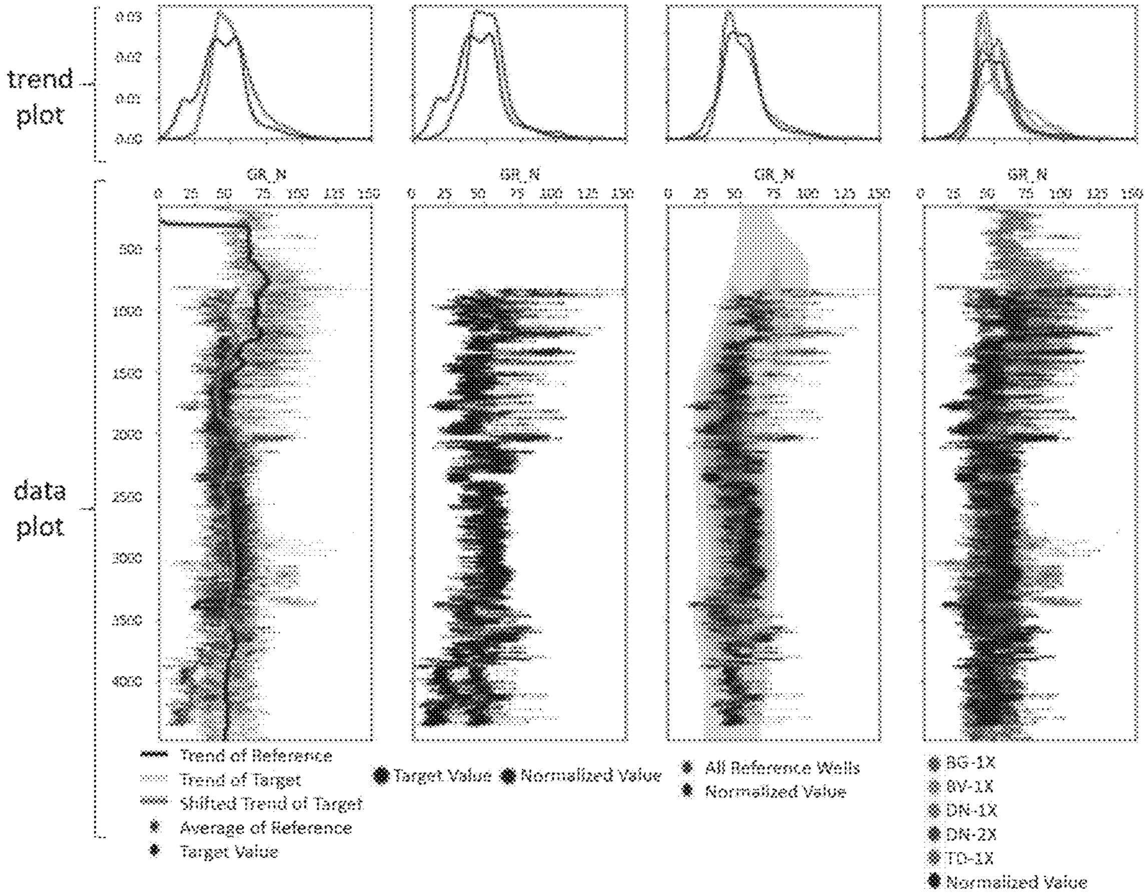
FIG. 12C illustrates plots of the target well log adjusted according to the reference well log based on an embodiment.

FIG. 12A illustrates an example of an interface screen in which the condition is input to adjust the trends S33 based on an embodiment. FIG. 12B is a view illustrating plots of the target well log and the reference well log based on an embodiment. FIG. 12C illustrates plots of the target well log adjusted according to the reference well log based on an embodiment.

In some implementations, the adjusting of the trends (S33) may include: filtering the feature data by using a filter, calculating the trend by using the filtered data; and adjusting overall data of the target well log so that the trend of the target well log is similar to the trend of the reference well log. That is, since the filtered data is used to generate the trends rather than the data of the entire well log, the data for generating the trends may be selected by inputting a filtering condition. In addition, the filtered data is a fraction of the data, and the entire data is adjusted so that the trends generated on the basis of the fraction of the data are similar to each other, so that the trends of the filtered data area may be adjusted so that the entire data follows the trends.

In some implementations, the adjusting of the trends (S33) may include inputting a minimum value (min) and a maximum value (max) of the data of the input features through a filter item, and providing a twentieth interface screen SC20. In the twentieth interface screen SC20 a reference well (Reference well:) and a target well (target well:) are selected, a minimum value of a feature (Min of feature) and a maximum value of a feature (Max of feature) are input, and a minimum value of a depth (Min of depth) and a maximum value of a depth (Max of depth) are input.

In the twentieth interface screen SC20, at least one filter may be input in the filter item. In a first filter (Filter 1), an input feature (feature), a minimum value (min), and a maximum value (max) may be input. In a second filter (Filter 2), an input feature (feature), a minimum value (min), and a maximum value (max) may be input. The data of the well log may be filtered by using the filter, and the trend may be calculated by using the remaining data. The user may input the feature, the minimum value, and the maximum value in the filter, and may filter the data area that is a core area to adjust the trend.

In a missing imputation (Missing Imputation) tab in the twentieth interface screen SC20 as described with reference to FIG. 8, when the reference well log or the target well log include the null data, a condition for generating alternative data to replace the null data is input by using the polynomial fitting. When the performing conditioning S20 is performed on the reference well log and the target well log and the null data does not exist, a missing imputation item is not required to be input.

The twentieth interface screen SC20 may receive input of a reference well (Reference Well:) item, a target well (Target Well:) item, a minimum value of a feature (Min of feature) item, a maximum value of a feature (Max of feature) item, a minimum value of a depth (Min of depth), a maximum value of a depth (Max of depth), and a window size item. Since the description of the reference well, the target well, the minimum and maximum values of the feature is already described in the description of the nineteenth interface screen SC19, a repeated description will be omitted. In a slide bar of the window size, a window size used for generating a trend in a moving average method. The user may input a window size by using the slide bar.

The user may adjust the trend of the target well log to be moved toward the trend of the reference well log. The user may select a position shift button (not shown) to move the trend of the well log, and may enter a value to move. The processor 11 may move the trend of the well log according to the input value. In the trend plots in FIG. 12B, it can be seen that each peak of two trends exists at different positions. When the trend of the target well log is adjusted so that the trend of the target well log moves toward the trend of the reference well log, each peak of the trends in the trend plots in FIG. 12C may be adjusted so that each peak of the trends exists at a similar position. When the data plots in FIG. 12B are compared to the data plots in FIG. 12C, the data displayed in the data plots in FIG. 12C are modified in a form in which the distribution is generally concentrated.

Through this process, the trend may be normalized by matching the target well log to the reference well log that are geographically or geologically similar. Therefore, the quality of the well log data may be improved by adjusting the trend of the well log in which the bad hole section is replaced with the alternative data according to the trend of the reference well log.

A program code may be written so that the process as described above is performed, and the program code may be stored in the storage unit 12. The program code may be executed by the processor 11, and may be written so as to perform at least one of the multiple processes described above. The storage unit 12 may include a storage medium. The storage medium may include a program code that is written so as to perform at least one of the multiple processes described above, and may be communicatively connected by the processor 11.

Only specific examples of implementations of certain embodiments are described. Variations, improvements and enhancements of the disclosed embodiments and other embodiments may be made based on the disclosure of this patent document.

What is claimed is:

1. A well log quality improvement method comprising:

performing a quality controlling operation on a well log by inputting a well log into a determination model for training to determine a bad hole section in the well log associated with a bad hole which is incorrectly measured, missing, or unmeasured data in the well log that is inappropriate for use in a well log interpretation;

displaying to a user a bad hole distribution according to depth information of the incorrectly measured, missing, or unmeasured data in the well log;

performing a conditioning operation on the well log by replacing the bad hole section included in the bad hole distribution of the well log with alternative data to produce conditioned data in the well log; and normalizing a distribution of the conditioned data of the well log according to a distribution of reference data of a reference well log obtained from a reference well to produce a normalized distribution of the conditioned data.

2. The method of claim 1, wherein the performing the quality controlling operation comprises:

setting a condition and a determination model for determining the bad hole;

analyzing the well log by using the condition and the determination model; and displaying a section determined as the bad hole section, wherein the displaying of the section includes at least one of a cross-plot in which data are displayed as points according to a feature of an X-axis and a feature of a Y-axis, a depth-plot in which the section determined as the bad hole for features selected as an input feature is displayed, and a bad hole score plot in which: bad hole scores are sorted from a small value to a large value; a line graph is drawn; and a point where a slope rapidly changes is displayed.

3. The method of claim 2, wherein the setting of the condition and the determination model includes inputting a selection by the user by providing:

a first interface screen in which a well log file stored in a storage unit is selected, a position of a line displaying a feature unit is selected, and a value determined as null data is input;

a second interface screen in which each column where a name of a well, a depth, a record of whether or not the bad hole exists, and the input feature are positioned is selected as variables;

a third interface screen in which at least one of a None, a MinMaxScaler, a RobustScaler, or a StandardScaler is selected as a scaler;

a fourth interface screen in which at least of a KNN, a COPOD, an Iforest, and an OCSVM is selected as a determination model; and a fifth interface screen in which a parameter of the determination model is input.

4. The method of claim 3, wherein the analyzing of the well log includes, in response to multiple parameters that are simultaneously input in an interface screen where the parameter of the determination model is input, generating each determination model for the multiple parameters at once, and integrating and displaying results.

5. The method of claim 2, wherein the performing the quality controlling operation further comprises merging results of determining the bad hole section with various conditions for one well log, and wherein the merging of the results includes displaying multiple results determining the bad hole section in depth-plots, and generating a bad hole determination result by reflecting an area selected from the depth-plots in a merged depth-plot.

6. The method of claim 1, wherein the performing conditioning operation comprises:

setting a condition and a generation model for generating the alternative data;

replacing null data of the well log with the alternative data by generating the alternative data using the generation model and the condition are used and reflecting a depth trend;

matching a trend of synthetic data generated using an empirical formula to a trend of the well log replaced with the alternative data by adjusting the synthetic data using an auto trend matching method; and replacing the bad hole section of the well log with the synthetic data that is adjusted.

7. The method of claim 6, wherein the replacing of the null data with the alternative data is configured perform any one of:

a first operation in which a moving average as the generation model is used for generating the alternative data by using data that is not the null data of the well log and the null data is replaced with the alternative data;

a second operation in which a first polynomial fitting as the generation model is used for generating the alternative data in which a depth trend trained from data that is not the null data of the well log is reflected and the null data is replaced with the alternative data; and a third operation in which a second polynomial fitting as the generation model is used for generating the alternative data by reflecting a depth trend trained from data that is not null data of a neighbor well log and by using data that is not the null data of the well log, and then by replacing the null data with the alternative data.

8. The method of claim 6, wherein the adjusting of the synthetic data comprises:

acquiring a trend of the well log replaced with the alternative data by using a moving average method;

acquiring a trend of the synthetic data generated from the empirical formula by using the moving average method; and matching the trend of the synthetic data with the trend of the well log replaced with the alternative data by adjusting a window size of a moving average.

9. The method of claim 1, wherein the normalizing of the distribution of data of the well log comprises:

setting a condition for matching a data distribution of a target well log to a data distribution of the reference well log based on a condition and a trend for visualizing the well log;

displaying a trend of the target well log and a trend of the reference well log by using the condition; and matching the trend of the well log to the trend of the reference well log by adjusting a trend of the well log.

10. The method of claim 9, wherein the displaying of the trends includes: calculating the trend of the target well log and the trend of the reference well log by using a moving average method; and displaying the trend of the target well log and the trend of the reference well log as plots based on the reference well log, the target well log, a visualization type, a bin value, ranges of features and depths to be visualized that are input upon setting the condition.

11. The method of claim 9, wherein the adjusting of the trend includes: filtering feature data by using a filter; calculating the trend by using filtered data; and adjusting overall data of the target well log so that the trend of the target well log is similar to the trend of the reference well log.

12. A well log quality improvement apparatus comprising:

a processor operable to execute computer codes and instructions;

a storage unit coupled to be in communication with the processor and configured to store a program code; and an input/output interface coupled to be in communication with the processor and configured to receive a command from a user and visually display data to the user, wherein the processor is operable to execute the program code to perform:

performing a quality controlling operation on a well log by inputting a well log into a determination model to train the determination model and to determine a bad hole section in the well log associated with a bad hole which is incorrectly measured, missing, or unmeasured data in the well log that is inappropriate for use in a well log interpretation;

displaying to the user a bad hole distribution according to depth information of the incorrectly measured, missing, or unmeasured data in the well log;

performing a conditioning operation on the well log by replacing the bad hole section included in the bad hole distribution of the well log with alternative data to produce conditioned data of the well log; and normalizing a distribution of the conditioned data of the well log according to a distribution of reference data of a reference well log obtained from a reference well to produce a normalized distribution of the conditioned data.

13. The apparatus of claim 12, wherein the performing the quality controlling operation comprises:

setting a condition and a determination model for determining the bad hole;

analyzing the well log by using the condition and the determination model; and displaying a section determined as the bad hole section, wherein the displaying of the section includes at least one of a cross-plot in which data are displayed as points according to a feature of an X-axis and a feature of a Y-axis, a depth-plot in which the section determined as the bad hole for features selected as an input feature is displayed, and a bad hole score plot in which: bad hole scores are sorted from a small value to a large value; a line graph is drawn; and a point where a slope rapidly changes is displayed.

14. The apparatus of claim 13, wherein the setting of the condition and the determination model includes inputting a selection by the user by providing:

a first interface screen in which a well log file stored in a storage unit is selected, a position of a line displaying a feature unit is selected, and a value determined as null data is input;

a second interface screen in which each column where a name of a well, a depth, a record of whether or not the bad hole exists, and the input feature are positioned is selected as variables;

a third interface screen in which at least one of a None, a MinMaxScaler, a RobustScaler, or a StandardScaler is selected as a scaler;

a fourth interface screen in which at least of a KNN, a COPOD, an Iforest, and an OCSVM is selected as a determination model; and a fifth interface screen in which a parameter of the determination model is input.

15. The apparatus of claim 14, wherein the analyzing of the well log includes, in response to multiple parameters that are simultaneously input in an interface screen where the parameter of the determination model is input, generating each determination model for the multiple parameters at once, and integrating and displaying results.

16. The apparatus of claim 13, wherein the performing the quality controlling operation further comprises merging results of determining the bad hole section with various conditions for one well log, and wherein the merging of the results includes displaying multiple results determining the bad hole section in depth-plots, and generating a bad hole determination result by reflecting an area selected from the depth-plots in a merged depth-plot.

17. The apparatus of claim 12, wherein the performing conditioning operation comprises:

setting a condition and a generation model for generating the alternative data;

replacing null data of the well log with the alternative data by generating the alternative data using the generation model and the condition are used and reflecting a depth trend;

matching a trend of synthetic data generated using an empirical formula to a trend of the well log replaced with the alternative data by adjusting the synthetic data using an auto trend matching method; and replacing the bad hole section of the well log with the synthetic data that is adjusted.

18. The apparatus of claim 17, wherein the replacing of the null data with the alternative data is configured perform any one of:

a first operation in which a moving average as the generation model is used for generating the alternative data by using data that is not the null data of the well log and the null data is replaced with the alternative data;

a second operation in which a first polynomial fitting as the generation model is used for generating the alternative data in which a depth trend trained from data that is not the null data of the well log is reflected and the null data is replaced with the alternative data; and a third operation in which a second polynomial fitting as the generation model is used for generating the alternative data by reflecting a depth trend trained from data that is not null data of a neighbor well log and by using data that is not the null data of the well log, and then by replacing the null data with the alternative data.

19. The apparatus of claim 17, wherein the adjusting of the synthetic data comprises:

acquiring a trend of the well log replaced with the alternative data by using a moving average method;

acquiring a trend of the synthetic data generated from the empirical formula by using the moving average method; and matching the trend of the synthetic data with the trend of the well log replaced with the alternative data by adjusting a window size of a moving average.

20. The apparatus of claim 12, wherein the normalizing of the distribution of data of the well log comprises:

setting a condition for matching a data distribution of a target well log to a data distribution of the reference well log based on a condition and a trend for visualizing the well log;

displaying a trend of the target well log and a trend of the reference well log by using the condition; and matching the trend of the well log to the trend of the reference well log by adjusting a trend of the well log.

* * * * *